United States Patent
Kang et al.

(10) Patent No.: US 9,543,032 B2
(45) Date of Patent: *Jan. 10, 2017

(54) NONVOLATILE MEMORY DEVICE, MEMORY SYSTEM INCLUDING THE SAME, AND METHOD OF OPERATING NONVOLATILE MEMORY DEVICE

(71) Applicant: SAMSUNG ELECTRONICS CO., LTD., Suwon-si, Gyeonggi-Do (KR)

(72) Inventors: Sangchul Kang, Hwaseong-si (KR); Seokcheon Kwon, Yongin-si (KR); Soo-Woong Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,176

(22) Filed: Oct. 20, 2014

(65) Prior Publication Data

US 2015/0036435 A1 Feb. 5, 2015

Related U.S. Application Data

(63) Continuation of application No. 13/342,239, filed on Jan. 3, 2012, now Pat. No. 8,867,278.

(Continued)

(30) Foreign Application Priority Data

Apr. 20, 2011 (KR) .................. 10-2011-0036943

(51) Int. Cl.
*G11C 16/04* (2006.01)
*G11C 16/30* (2006.01)
(Continued)

(52) U.S. Cl.
CPC .......... *G11C 16/30* (2013.01); *G11C 11/5628* (2013.01); *G11C 16/0483* (2013.01); *G11C 16/06* (2013.01); *G11C 16/10* (2013.01); *G11C 16/3436* (2013.01)

(58) Field of Classification Search
CPC .................................................... G11C 16/30
(Continued)

(56) References Cited

U.S. PATENT DOCUMENTS 5,490,107 A   2/1996 Akaogi et al.
6,597,603 B2  7/2003 Lambrache et al.
(Continued)

FOREIGN PATENT DOCUMENTS

CN   1881468 A   12/2006
CN   1925058 A   3/2007
(Continued)

*Primary Examiner* — Hoai V Ho
(74) *Attorney, Agent, or Firm* — Volentine & Whitt, PLLC

(57) ABSTRACT

A non-volatile memory device includes a non-volatile memory cell array including a plurality of word lines, a voltage generator configured to generate a first high-voltage using a supply voltage and a second high-voltage using an external voltage which is higher than the supply voltage, and a word line selection circuit configured. The word line selection circuit is configured apply, during a program operation of the memory cell array, the first high-voltage to a selected word line among the plurality of word lines, and the second high-voltage to unselected word lines among the plurality of word lines.

20 Claims, 26 Drawing Sheets

Related U.S. Application Data

(60) Provisional application No. 61/447,133, filed on Feb. 28, 2011.

(51) Int. Cl.
- *G11C 11/56* (2006.01)
- *G11C 16/06* (2006.01)
- *G11C 16/10* (2006.01)
- *G11C 16/34* (2006.01)

(58) Field of Classification Search
USPC .......................................... 365/185.2, 185.18
See application file for complete search history.

(56) References Cited

U.S. PATENT DOCUMENTS

| | | | |
|---|---|---|---|
| 7,120,061 B2 | 10/2006 | Daga | |
| 7,430,149 B2 | 9/2008 | Yoshinaga et al. | |
| 7,450,429 B2 | 11/2008 | Daga | |
| 7,492,654 B2 | 2/2009 | Won et al. | |
| 7,639,540 B2 | 12/2009 | Kim et al. | |
| 7,800,955 B2 * | 9/2010 | Won | G11C 16/3454 365/185.22 |
| 7,898,851 B2 * | 3/2011 | Maejima | G11C 16/26 365/185.03 |
| 8,014,224 B2 | 9/2011 | Yoshinaga et al. | |
| 8,867,278 B2 * | 10/2014 | Kang | G11C 11/5628 365/185.2 |
| 2003/0075735 A1 * | 4/2003 | Nakano | G06K 19/0701 257/200 |
| 2008/0089130 A1 * | 4/2008 | Park | G11C 8/08 365/185.18 |
| 2008/0198657 A1 | 8/2008 | Kim et al. | |
| 2008/0198663 A1 * | 8/2008 | Kim | G11C 16/3418 365/185.23 |
| 2010/0214837 A1 * | 8/2010 | Sako | G11C 5/147 365/185.03 |
| 2011/0051520 A1 * | 3/2011 | Kim | G11C 11/5628 365/185.19 |
| 2012/0069681 A1 * | 3/2012 | Oikawa | G11C 11/5628 365/185.24 |
| 2012/0081959 A1 * | 4/2012 | Lee | G11C 11/5642 365/185.09 |

FOREIGN PATENT DOCUMENTS

| | | |
|---|---|---|
| CN | 1961379 A | 5/2007 |
| JP | 06-124597 | 5/1994 |
| JP | 2005509241 A | 4/2005 |
| JP | 2010518544 A | 5/2010 |
| KR | 960000619 B1 | 1/1996 |
| KR | 1020050020752 A | 3/2005 |
| KR | 1020090130093 A | 12/2009 |

* cited by examiner

NONVOLATILE MEMORY DEVICE, MEMORY SYSTEM INCLUDING THE SAME, AND METHOD OF OPERATING NONVOLATILE MEMORY DEVICE

CROSS-REFERENCE TO RELATED APPLICATIONS

This is a Continuation of U.S. application Ser. No. 13/342,239, filed Jan. 3, 2012, and a claim of priority under 35 U.S.C §119 is made to Korean Patent Application No. 10-2011-0036943, filed Apr. 20, 2011, and to U.S. provisional Patent Application No. 61/447,133, filed Feb. 28, 2011, the entireties of which are incorporated by reference herein.

BACKGROUND

The inventive concepts generally relate to non-volatile memory devices and systems, and more particularly, to the generation of various voltages utilized in non-volatile memory devices and systems.

Semiconductor memory devices are generally classified as either volatile semiconductor memory devices or non-volatile memory devices. Volatile semiconductor memory devices lose stored data in the event of an interruption in power supply, whereas non-volatile memory device retain stored data in the event of an interruption in power supply.

Examples of non-volatile semiconductor memory devices include mask read-only memories (MROM), programmable read-only memories (PROM), erasable programmable read only memories (EPROM), electrically erasable programmable read only memories (EEPROM), and so on.

Developed from EEPROM technology, the NAND flash memory device has become widely adopted for non-volatile mass data storage applications. For example, NAND flash memory devices are commonly employed to store audio, image and/or video data in a myriad of different types of host devices, such as computers, mobile phones, personal digital assistants (PDAs), a digital cameras, camcorders, voice recorders, MP3 players, handheld personal computers (PCs), game consoles, facsimile machines, scanners, printers and so on.

Depending on the number of bits stored per memory cell, non-volatile memory devices, such as NAND flash memory devices, are generally classified as either single level cell (SLC) devices or multi-level cells (MLC) devices. SLC devices store a single bit of data in each non-volatile memory cell, whereas MLC devices store 2 or more bits of data in each non-volatile memory cell.

There is a continual demand in the industry to increase the integration density of semiconductor devices, particularly mass storage devices such as NAND flash memory device. As such, for example, MLC devices are becoming more commonplace in the market. However, efforts to increase device integration are attended by a number of significant design challenges, including minimizing power consumption and maintaining operational stability.

SUMMARY

According to an aspect of the inventive concepts, a non-volatile memory device is provided which includes a non-volatile memory cell array including a plurality of word lines, a voltage generator configured to generate a first high-voltage using a supply voltage and a second high-voltage using an external voltage which is higher than the supply voltage, and a word-line selection circuit configured to apply, during a program operation of the memory cell array, the first high-voltage to a selected word line among the plurality of word lines, and the second high-voltage to unselected word lines among the plurality of word lines.

According to another aspect of the inventive concepts, a memory system is provided which includes a memory controller and a non-volatile memory device configured to be controlled by the memory controller. The non-volatile memory device includes a voltage generator configured to generate a first high-voltage using a supply voltage and a second high-voltage using an external voltage which is higher than the supply voltage, and a word-line selection circuit configured to apply, during a program operation of the memory cell array, the first high-voltage to a selected word line among the plurality of word lines, and the second high-voltage to unselected word lines among the plurality of word lines.

According to yet another aspect of the inventive concepts, a method of operating a non-volatile memory device is provided which includes generating a first high-voltage from an supply voltage, generating a second high-voltage from an external voltage which is higher than the supply voltage, and applying the first high-voltage to a selected word line of the non-volatile memory device and the second high-voltage to unselected word lines of the non-volatile memory device during a programming operation of the non-volatile memory device.

BRIEF DESCRIPTION OF THE FIGURES

The above and other aspects and features of the inventive concepts will become readily apparent from the detailed description that follows, with reference to the accompanying drawings, in which.

DETAILED DESCRIPTION

Figure 1:
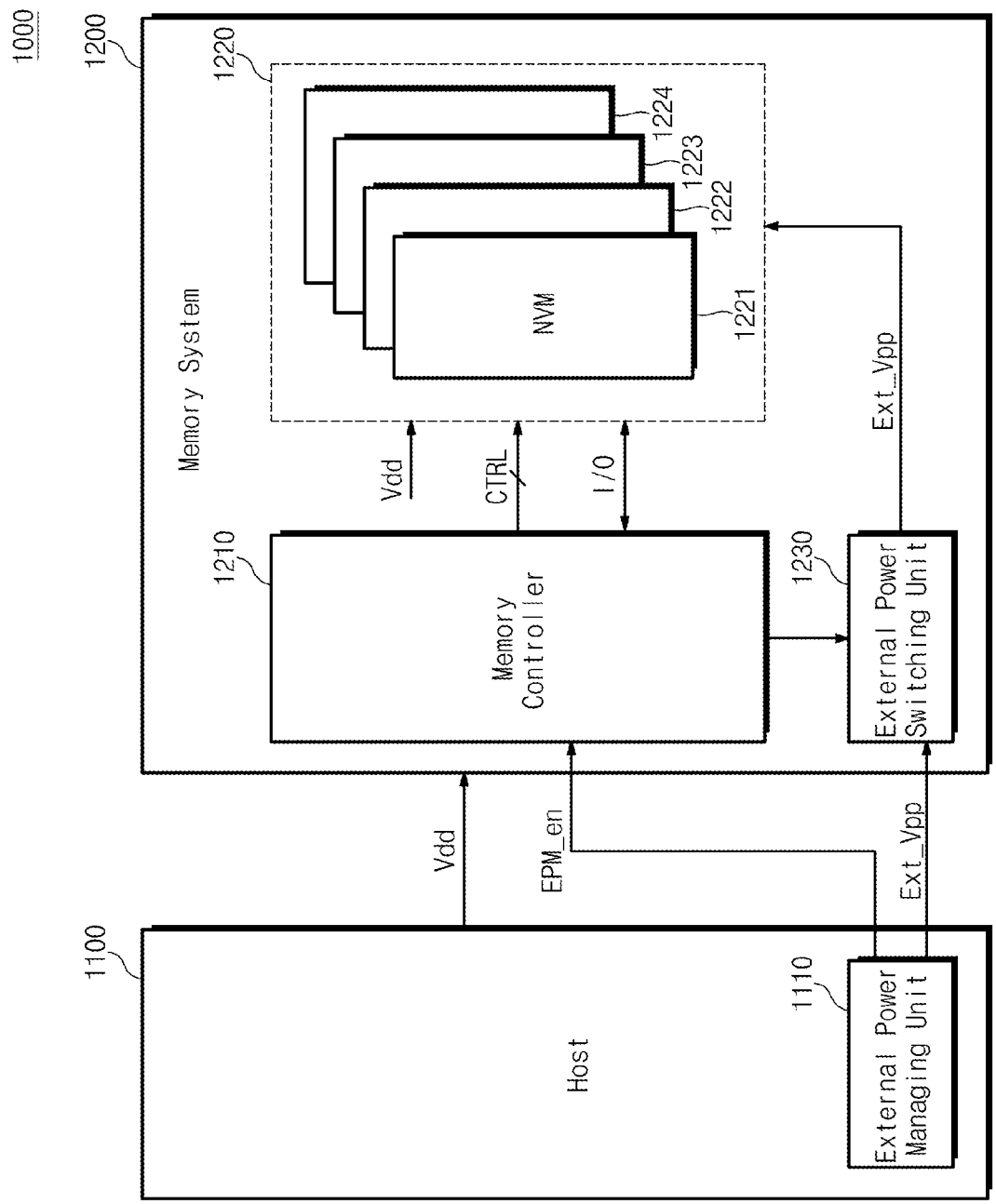
FIG. 1 is a block diagram of an electronic device according to one or more embodiments of the inventive concepts.

The inventive concepts will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the sizes and relative sizes of layers and regions may be exaggerated for clarity. Like reference characters refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present disclosure and will not be interpreted in an idealized or overly formal sense unless expressly so defined herein.

As is customary in the field of the inventive concepts, elements of the embodiments may be described in terms of functional units illustrated in block diagram format. It will be well understood by those skilled in the art that these functional units are physically implemented by electronic circuits, with or without software-implemented control The embodiments that follow adopt a NAND flash memory as a memory technology of non-volatile memory devices of the inventive concepts. However, the inventive concepts are not limited thereto. Other examples of non-volatile memory devices to which the inventive concepts are applicable include vertical NAND flash memories, NOR flash memories, resistive random access memories (RRAM), phase-change random access memories (PRAM), magnetroresistive random access memories (MRAM), ferroelectric random access memories (FRAM), spin transfer torque random access memories (STT-RAM), and the like.

FIG. 1 is a block diagram of an electronic device according to exemplary embodiments of the inventive concepts.

Referring to FIG. 1, an electronic device 1000 includes a host 1100 and a memory system (or storage device) 1200. The host 1100 of this example includes an external power managing unit 1110. The memory system 1200 of this example includes a memory controller 1210, a non-volatile memory 1220, and an external power switching unit 1230.

Examples of the host 1100 include handheld electronic devices such as personal/handheld computer personal digital assistants (PDA), portable media player (PMP), MP3 players, and the like. An example of the memory system 1200 is a solid state disk/drive (SSD). Other examples of the memory system 1200 include a Personal Computer Memory Card International Association (PCMCIA) Card, a compact flash (CF) card, a smart media card (SM, SMC), a memory stick, a multimedia card (MMC, RS-MMC, MMC-micro), a security card (SD, miniSD, microSD, SDHC), a universal flash storage (UFS) device, and the like. An exemplary memory system 1200 is disclosed in U.S. Patent Publication No. 2010-0082890, the entirety of which is incorporated by reference herein.

The host 1100 and the memory system 1200 may be operatively connected using any of a variety of standardized interface, examples of which include PPN, USB, SCSI, ESDI, SATA, SAS, PCI-express, and IDE interfaces. The inventive concepts are not limited by the interface configuration between the host 1100 and memory system 1200.

In operation, the memory system 1200 generates a variety of different operational voltages which are applied to word lines of the non-volatile memory 1220. For example, in a programming operation, the generated word line voltages include a program voltage applied to a selected word line of the non-volatile memory 1220 and a pass voltage applied to unselected word lines of the non-volatile memory 1220. In a read verification operation (which forms part of the programming operation and is executed to verify programming results), the generated word line voltages include a read verification voltage provided to a selected word line of the non-volatile memory 1220 and verification pass voltage applied to unselected word lines of the non-volatile memory 1220. In a read operation, the generate word line voltages include a read voltage provided to a selected word line of the non-volatile memory 1220, and a read pass voltage applied to unselected word lines of the non-volatile memory 1220. It is noted that the voltage level of the verification pass voltage may be the same as that of the read pass voltage.

Among these various word line voltages, some are characterized as "high-voltage" since they are generated at voltage levels which exceed a power supply voltage (Vdd). For example, the program voltage, pass voltage, verification pass voltage and read pass voltage mentioned above may all exceed the power supply voltage Vdd. It is noted here that a technique of generating word line voltages using an externally supplied high voltage is disclosed in U.S. Pat. No. 7,672,170, the entirety of which is incorporated by reference herein.

Still referring to the example of FIG. 1, the external power managing unit 1110 of the host 1100 generates an external high voltage Ext_Vpp and an external power enable signal EPM_en which, as described later herein, are utilized within the memory system 1200. In an exemplary embodiment, the external high voltage Ext_Vpp is in a range between 11V and 16V, inclusive. However, the inventive concepts are not limited to this particular voltage range.

The memory controller 1210 of the memory system 1200 controls a read operation, a program operation, and an erase operation of the non-volatile memory 1220 in response to requests/commands transferred as control signals CTRL from the host 1100.

The external power switching unit 1230 receives the external high voltage Ext_Vpp from the host 1100, and transfers the external high voltage Ext_Vpp to the non-volatile memory 1220 under control of the memory controller 1210. The external power switching unit 1230 may constitute a separate circuit within the memory system 1200, or may constitute a part of and/or be implemented within the memory controller 1210.

The non-volatile memory 1220 of the example of FIG. 1 includes a plurality of non-volatile memory devices 1221, 1222, 1223 and 1224, which may be formed of the same type of non-volatile memory or different types of non-volatile memory. In the particular example of the present embodiments, each of the non-volatile memory devices 1221~1224 is a NAND flash memory chip. The memory controller 1210 communicates with the non-volatile memory devices 1221~1224 over respective data input/output (I/O) channels. Also, the inventive concepts are not limited to the provision of plural memory devices in the non-volatile memory 1220. That is, the non-volatile memory 1220 may instead contain a single non-volatile memory device.

According to the embodiments associated with FIG. 1, the memory system 1220 is operative in at least two power modes depending upon a state of the external power enable signal EPM_en. A first mode is referred to as a normal mode (also called a first power mode herein), and a second mode is referred to as an outside voltage mode OVM (also called a second power mode herein). When the external power enable signal EPM_en from host 1110 is inactive (or OFF), the memory system 1220 is operative in the normal mode. When the external power enable signal EPM_en from host 1110 is active (or ON), the memory system 1220 is operative in the outside voltage mode OVM.

In the normal operating mode, the non-volatile memory 1220 generates operational word lines voltages from the power supply voltage Vdd. For example, a charge pump may be utilized to generate the necessary high-voltage word line voltages from the power supply voltage Vdd. It is noted that the power supply voltage Vdd may be supplied to the non-volatile memory 1220 from the host 1100, the memory controller 1210, or a voltage regulator (not shown).

In the outside voltage mode OVM, the memory controller 1210 controls the external power switching unit 1230 to transfer the external high voltage Ext_Vpp to the non-volatile memory 1220, and the non-volatile memory 1220 generates at least some of the operational word lines voltages from the external high voltage Ext_Vpp. In this case, in the example of FIG. 1, at least one of the non-volatile memory devices 1221 to 1224 is configured to support the outside voltage mode OVM. If any of the non-volatile memory devices 1221 to 1224 are not configured to support the outside voltage mode OVM, then such device(s) would operate in the normal mode while the OVM supported device(s) would operate in the outside voltage mode OVM. In at least part of the explanation that follows, it is assumed that the first non-volatile memory device 1221 of FIG. 1 supports the outside voltage mode OVM.

It is noted there that, in a modification of the example of FIG. 1, the external power switching unit 1230 is omitted, and the external high voltage Ext_Vpp is provided directly to the non-volatile memory 1220. This modification and other are described later in connection with other embodiment of the inventive concepts.

In the present example of FIG. 1, the memory controller 1210 sets the power mode of each of the non-volatile memory devices 1221 to 1224 according to the external power enable signal EPM_en from host 1110. However, the inventive concepts are not limited thereto. For example, the non-volatile memory devices 1221 to 1224 may directly receive the external power enable signal EPM_en, and set their respective power modes accordingly. As another example, the external power enable signal EPM_en may be omitted, and the non-volatile memory devices 1221 to 1224 may detect the presence or absence of the external high voltage Ext_Vpp, and set their respective power modes accordingly. Also, as mentioned above, the set power modes of the non-volatile memory devices 1221 to 1224 may be the same as or different than each other.

Figure 2:
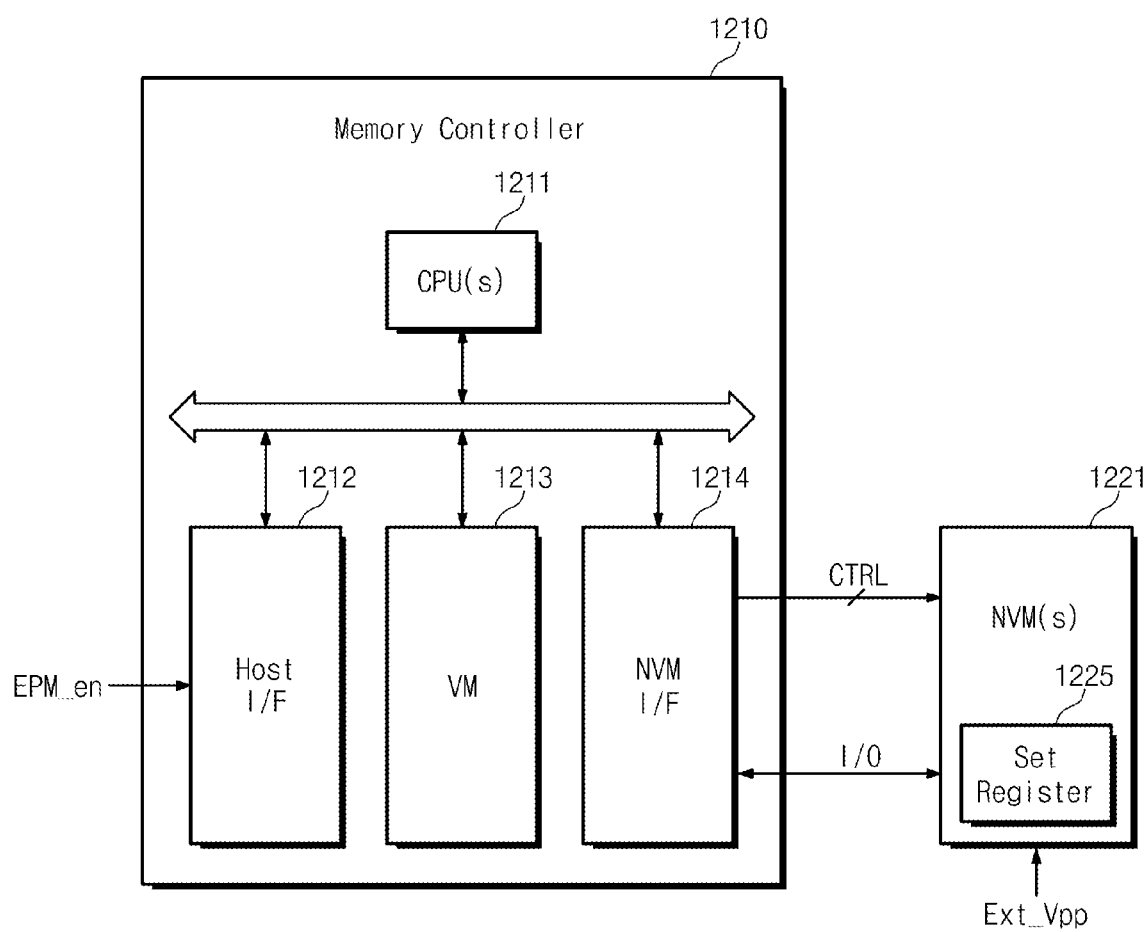
FIG. 2 is a block diagram of a memory controller shown in FIG. 1 according to one or more embodiments of the inventive concepts.

FIG. 2 is a block diagram illustrating examples of the memory controller 1210 and non-volatile memory device 1221 shown in FIG. 1. As stated above, it is assumed that a non-volatile memory device 1221 supports the outside voltage mode OVM.

Referring to FIG. 2, the memory controller 1210 of this example includes at least one CPU 1211, a host interface 1212, a volatile memory device 1213, and a non-volatile memory interface 1214.

The CPU 1211 is configured to analyze and process signals input from the host 1100 shown in FIG. 1. The CPU 1211 controls the non-volatile memory device 1221 via the non-volatile memory interface 1214. The CPU 1211 controls an overall operation of the non-volatile memory device 1221 according to firmware installed for this purpose.

The host interface 1212 includes a data exchange protocol of the host 1100 which is coupled with a memory system 1200 shown in FIG. 1. The host interface 1212 provides an operational interface with the host 1100 based upon the data exchange protocol of the host 1100.

The volatile memory device 1213 temporarily stores write data provided from the host 1100 or data read out from the non-volatile memory device 1221. The volatile memory device 1213 is configured to store meta data to be stored in the non-volatile memory device 1221 or cache data. The volatile memory device 1221 may include a DRAM, an SRAM, and the like.

The non-volatile memory interface 1214 provides an interface with the non-volatile memory device 1221. The non-volatile memory interface 1214 transfers input/output I/O data provided from the volatile memory device 1213 to the non-volatile memory device 1221, and transfers I/O data read out from the non-volatile memory device 1221 to the volatile memory device 1213. In addition, the non-volatile memory interface 1214 provides the non-volatile memory device 1221 with control signals CTRL for controlling an overall operation of the non-volatile memory device 1221, in response to the control of the CPU 1211.

In an exemplary embodiment of the inventive concepts, the host interface 1212 receives the external power enable signal EPM_en from the external power managing unit 1110 of the host 1100. In this case, the CPU 1211 responds to the external power enable signal EPM_en to provide the non-volatile memory device 1221 with control signals and input/output I/O data via the non-volatile memory interface 1214. Further, the CPU 1211 controls an external power switching unit 1230 shown in FIG. 1 such that an external high voltage Ext_Vpp is provided to the non-volatile memory device 1221.

The non-volatile memory device 1221 is selectively set to the normal mode or the outside voltage mode OVM as described above. This may be done, for example, by setting a value of a set register 1225 of the non-volatile memory device 1221, in response to control signals CTRL provided from the memory controller 1210. Control signals CTRL, such as the external power enable signal EPM_en, related to setting of the normal mode or the outside voltage mode OVM are referred to herein as "power control information." For example, in the case where the external power enable signal EPM_en is active (or ON), the memory controller 1210 may control the non-volatile memory device 1221 to set a value corresponding to the outside voltage mode OVM in the set register 1225. This may be done by transmitting power control information to a control logic 160 of the non-volatile memory device 1221 described later in connection with FIG. 3, whereby the control logic 160 is responsive to the power control information to appropriately set a value of the set register 1225.

As one example of the outside voltage mode OVM of the inventive concepts, the non-volatile memory device 1221 generates some of the word line voltages from the external high voltage Ext_Vpp, and others of the word line voltages using the power supply voltage Vdd. For example, in a programming operation, a pass voltage Vpass and a read verification pass voltage Vread applied to unselected word lines may be generated from the external high voltage Ext_Vpp, while a program voltage Vpgm applied to a selected word line may be generated from the power supply voltage Vdd. This and other examples of the outside voltage mode OVM will be described in connection with the embodiments that follow.

Figure 3:
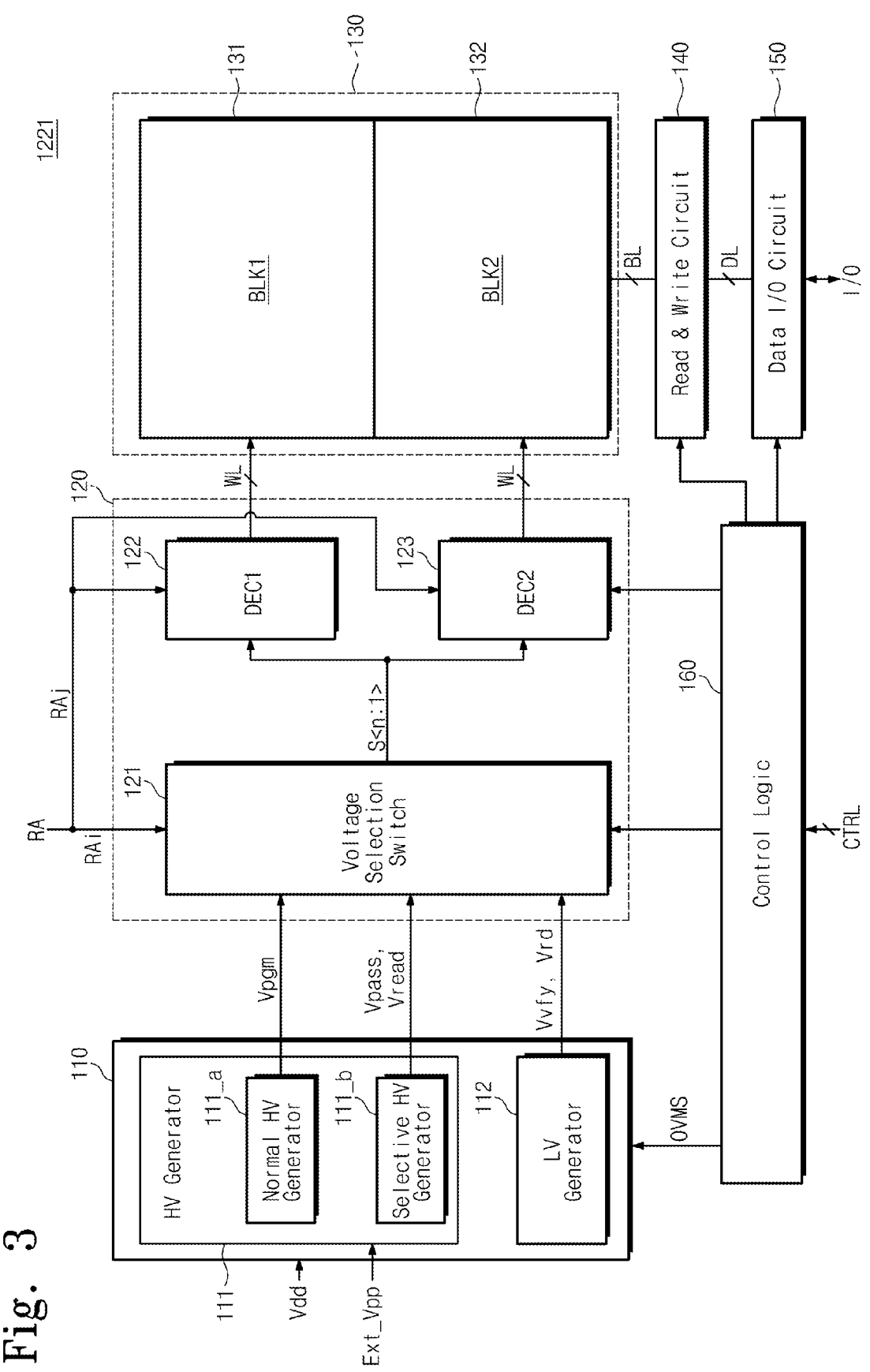
FIG. 3 is a block diagram of a non-volatile memory device shown in FIG. 2 according to one or more embodiments of the inventive concepts.

FIG. 3 is a block diagram of a non-volatile memory device 1221 shown in FIG. 2 according to one or more embodiments of the inventive concepts.

Referring to FIG. 3, the non-volatile memory device 1221 includes a voltage generation circuit 110, a row selection circuit 120, a memory cell array 130, a read and write circuit 140, a data input/output circuit 150, and control logic 160.

The control logic 160 controls an overall operation of the non-volatile memory device 1221. For example, the control logic 160 responds to a program request or a read request of the memory controller 1210 shown in FIG. 1, and controls an overall operation of the non-volatile memory device 1221 so as to perform a program operation or a read operation.

Assume here that the external high voltage Ext_Vpp is provided to the memory system 1200 shown in FIG. 1 from the host 1100 in FIG. 1, i.e., a value corresponding to the outside voltage mode OVM is stored in the set register 1225 as described above in connection with FIG. 2. In response to an OVM value stored in the set register 1225, the control logic 160 provides an outside voltage mode signal OVMS to the voltage generation circuit 110. In this manner, the outside voltage mode OVM is established.

The voltage generation circuit 110 generates voltages (i.e., word line voltages) to be provided to word lines WL of the memory cell array 130. The voltages are generated in accordance with the outside voltage mode OVM in response to the outside voltage mode signal OVMS from the control logic 160.

As shown in FIG. 3, the voltage generation circuit 110 of this example includes a high voltage (HV) generator 111 and a low voltage (LV) generator 112.

The high voltage generator 111 includes a normal high voltage generator 111_a and a selective high voltage generator 111_b. The normal high voltage generator 111_a generates a program voltage Vpgm to be supplied to a selected word line during a program operation, in response to control of the control logic 160. In this particular embodiment, the normal high voltage generator 111_a generate the program voltage Vpgm from the power supply voltage Vdd, for example, by charge pumping of the power supply voltage Vdd.

The selective high voltage generator 111_b responds to the control of the control logic 160, and generates a pass voltage Vpass to be supplied to unselected word lines during a program operation, or a read pass voltage Vread to be supplied to unselected word lines during a read operation.

In the case where the external high voltage Ext_Vpp is active (ON), the selective high voltage generator 111_b is operative according to the outside voltage mode signal OVMS received from the control logic 160. Namely, in the outside voltage mode OVM, the selective high voltage generator 111_b generates the pass voltage Vpass and the read pass voltage Vread from the external high voltage Ext_Vpp, for example, by reducing a voltage level of the external high voltage Ext_Vpp.

In the case where the external high voltage Ext_Vpp is inactive (OFF), the selective high voltage generator 111_b is operative according to the normal mode. Namely, in the normal mode, the selective high voltage generator 111_b generates the pass voltage Vpass and the read pass voltage Vread from the power supply voltage Vdd, for example, by charge pumping of the power supply voltage Vdd.

Under the control of the control logic 160, the low voltage generator 112 generates a verification read voltage Vvfy to be provided to a selected word line during a verification read operation which is included in a program operation, or a read voltage Vrd to be provided to a selected word line during a read operation. In the example of this embodiment, the low voltage generator 112 generates the verification read voltage Vvfy and the read voltage Vrd using a high voltage Vpp. Herein, the high voltage Vpp may be a high voltage generated by the normal high voltage generator 111_a or the selective high voltage generator 111_b. In another example of this embodiment, the verification read voltage Vvfy and/or the read voltage Vrd is lower than the power supply voltage Vdd, and the low voltage generator 112 generates the verification read voltage Vvfy and/or the read voltage Vrd using the power supply voltage Vdd.

The row selection circuit 120 is supplied with word line voltages Vpgm, Vpass, Vread, Vvfy, and Vrd from the voltage generation circuit 110, provides corresponding voltages to specified word lines WL in response to a row address RA. The row selection circuit 120 of this example includes a voltage selection switch 121, and first and second row decoders 122 and 123.

The voltage selection switch 121 generates selection signals S<1> to S<n> to be provided to the word lines WL in response to an address portion RAi of the row address RA.

For example, during a programming period of a program operation, the voltage selection switch 121 activates one of the selection signals S<1> to S<n> in response to the row address RAi and deactivates the remaining selection signals. The voltage selection switch 121 transfers the program voltage Vpgm onto the activated selection signal and the pass voltage Vpass onto the deactivated selection signals.

As another example, during a verification read period of a program operation, the voltage selection switch 121 transfers a verification read voltage Vvfy onto a selection signal which was activated at the program execution period and a verification pass voltage Vread onto selection signals deactivated at the program execution period.

As still another example, during a read operation, the voltage selection switch 121 activates one of the selection signals S<1> to S<n> in response to the row address RAi. At this time, the remaining selection signals are deactivated. The voltage selection switch 121 transfers the read voltage Vrd onto the activated selection signal and the read pass voltage Vread to the deactivated selection signals.

Each of the first and second row decoders 122 and 123 drives word lines WL with corresponding word line voltages in response to the selection signals S<1> to S<n> and a remaining portion RAj of the row address RA. In the example of this embodiment, the row address portion RAj is an address for selecting a memory block 131 or 132 (i.e., memory block BLK1 or BLK2). Also according to this example, the first row decoder 122 selects the second memory block 131 in response to the row address RAj, and that the second row decoder 123 selects a second memory block 132 in response to the row address RAj.

Each of the first and second row decoders 122 and 123 transfers word line voltages supplied via the selection signals S<1> to S<n> to word lines WL of a selected memory block. During a program execution period of a program operation, the program voltage Vpgm is applied to a selected word line, and the pass voltage Vpass is applied to unselected word lines, respectively. Further, during a read operation, the read voltage Vrd is applied to a selected word line, and the read pass voltage Vread is applied to unselected word lines, respectively.

The memory cell array 130 is connected to the row selection circuit 120 via word lines WL as described above. Further, the memory cell array 130 is connected to the read and write circuit 140 via bit lines BL. As mentioned above, the memory cell array 130 includes the first memory block 131 and the second memory block 132. Each of the first and second memory blocks 131 and 132 includes a plurality of memory cells each storing data. For convenience of description, two memory blocks 131 and 132 are illustrated in FIG. 3. However, the inventive concepts are not limited by the number of memory blocks in the memory cell array 130. In other words, the memory cell array 130 may have a single memory block, or two or more memory blocks.

The inventive concepts are also not limited by the number of bits stored in each memory cell. For example, the each memory cell of the memory cell array 130 may store a single bit of data, which is generally referred to as a single level cell (SLC) or a single bit cell (SBC). Alternatively, each memory cell of the memory cell array 130 may store two or more bits of data, which is generally referred to as a multi-level cell (MLC) or a multi bit cell (MBC). Further, the memory cell array 130 may include both SLC/SBC memory cells and MLC/MBC memory cells.

The read and write circuit 140 is connected to the memory cell array 130 via the bit lines BL and to the data input/output circuit 150 via data lines DL, and is operatively responsive to the control logic 160. In a programming operation, the read and write circuit 140 receives data from the data input/output circuit 150 to store the received data in the memory cell array 130. In a read operation, the read and write circuit 140 reads out data from the memory cell array 130 to transfer the read data to the data input/output circuit 150. For example, the read and write circuit 140 may include constituent elements such as a page buffer (or, a page register) for performing reading and writing of data, a column selector circuit of selecting bit lines BL, and other components.

The data input/output circuit 150 is connected to the read and write circuit 140 via the data lines DL. The data input/output circuit 150 is operatively responsive to the control logic 160, and is configured to exchange data I/O with an external device. In a program operation, the data input/output circuit 150 transfers data I/O provided from the external device to the read and write circuit 140 via the data lines DL. In a read operation, the data input/output circuit 150 transfers data I/O provided from the read and write circuit 140 via the data lines DL to the external device.

As described above with reference to FIG. 3, the non-volatile memory device 1221 supports the outside voltage mode OVM, and generates a high word line voltage (i.e., a pass voltage Vpass or a read pass voltage Vread) provided to unselected word lines using the external high voltage Ext_Vpp. In contrast, in the case where a high word line voltage is generated by charge pumping of the power supply voltage Vdd, a excessive transient peak current may occur. This can cause the generation of an unstable word line voltage, which in turn can result in an operational malfunction of the non-volatile memory device. This drawback may be avoid in the embodiments described above, since the voltage generation circuit 110 generates a high word line voltage for unselected word lines by lowering the external high voltage Ext_Vpp, thereby avoid transient peak current. In addition, since the high word line voltage simultaneously applied to the many unselected word lines is derived from the external voltage Ext_Vpp, power consumption within the non-volatile memory device is reduced.

Figure 4:
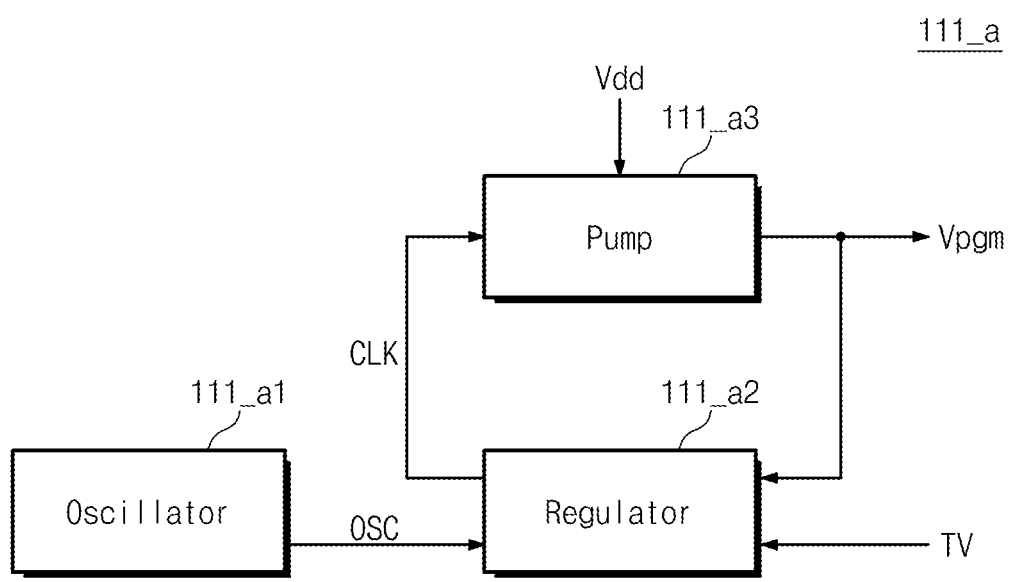
FIG. 4 is a block diagram of a an example of a high voltage generator shown in FIG. 3.

FIG. 4 is a block diagram showing an example of a normal high voltage generator 111_a which may be utilized in the embodiment of FIG. 3. In particular, the normal high voltage generator 111_a generates a program voltage Vpgm in response to the control of control logic 160 of FIG. 3 as described previously.

Referring to FIG. 4, the normal high voltage generator 111_a includes an oscillator 111_a1, a regulator 111_a2, and a charge pump 111_a3.

The oscillator 111_a1 generates an oscillation signal OSC. The regulator 111_a2 outputs the oscillation signal OSC as a clock CLK depending upon whether an output voltage of the charge pump 111_a3 is higher in level than a target voltage TV. The charge pump 111_a3 performs a pumping operation in response to the clock CLK. The charge pump 111_a3 pumps a voltage level of an output voltage up to a voltage level of the program voltage Vpgm by charging a plurality of serially-connected capacitors (not shown) with the power supply voltage Vdd.

Figure 5:
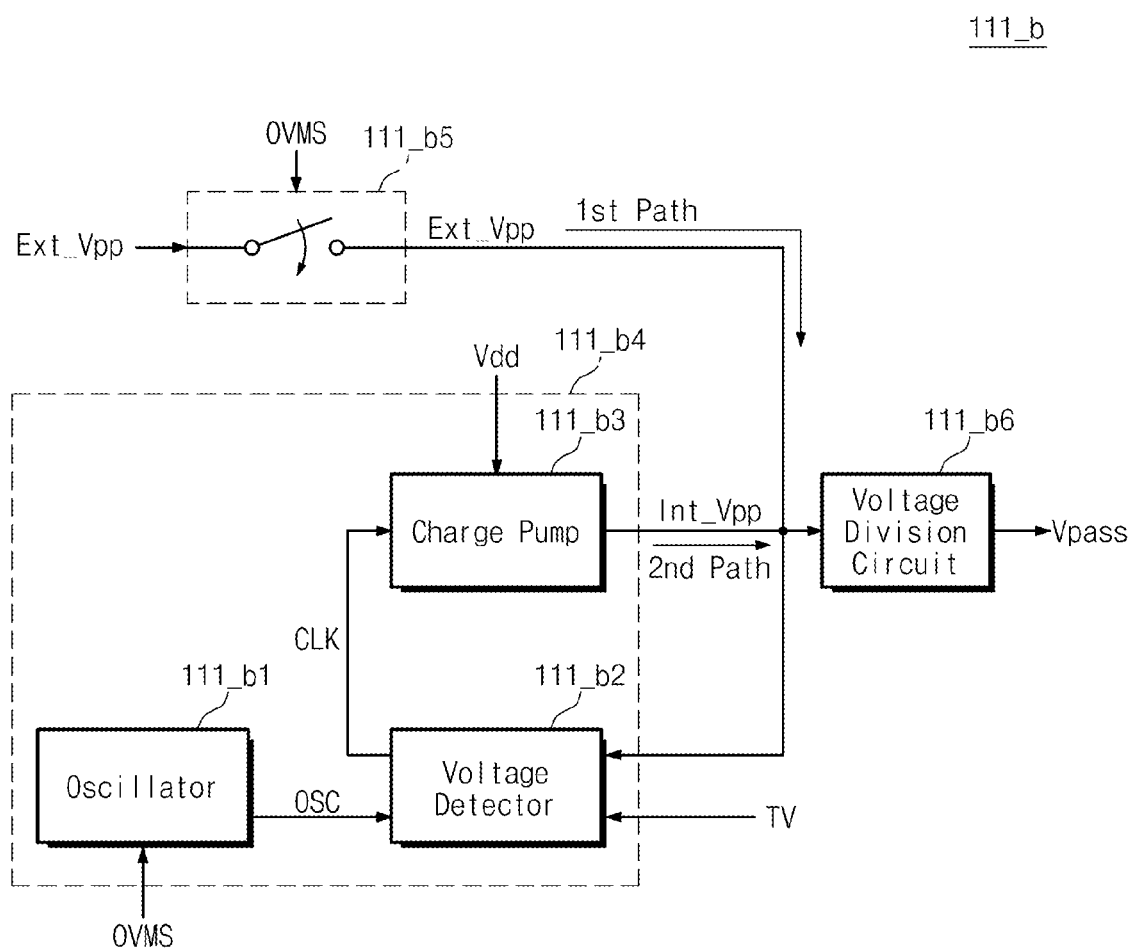
FIG. 5 is a block diagram of a selective high voltage generator in shown FIG. 3 according to one or more embodiments of the inventive concepts.
Figure 6:
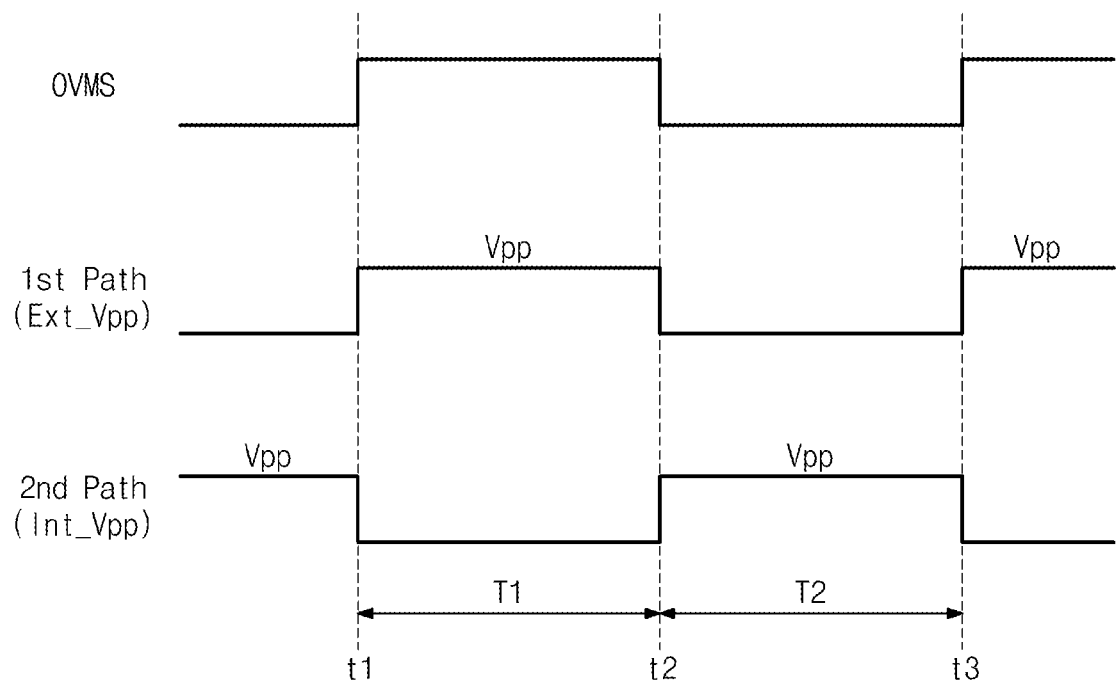
FIG. 6 is an timing diagram for describing an example of a transfer path of a voltage provided to a voltage division circuit of a selective high voltage generator in shown FIG. 5

FIG. 5 is a block diagram showing an example of a selective high voltage generator 111-b which may be utilized in the embodiment of FIG. 3, and FIG. 6 is a timing diagram for describing relative voltages of transfer paths illustrated in FIG. 5.

As described above, during programming, the selective high voltage generator 111_b generates a pass voltage Vpass in response to the control of the control logic 160 shown in FIG. 3. During reading, the selective high voltage generator 111_b generates a read pass voltage Vread in response to the control of the control logic 160 shown in FIG. 3. These high voltages Vpass and Vread are applied to unselected word lines WL. FIG. 3 illustrates the example were the pass voltage Vpass is generated.

Referring to FIG. 5, the selective high voltage generator 111_b includes an oscillator 111_b1, a regulator 111_b2, a charge pump 111_b3, a switching circuit 111_b5, and a voltage division circuit 111_b6. The oscillator 111_b1, the regulator 111_b2, and the charge pump 111_b3 are substantially the same as those describe above in connection with in FIG. 4, and are collectively referred to here as a pumping circuit 111_b4.

The selective high voltage generator 111_b generates the pass voltage Vpass in one of two ways depending upon whether the device is operating in the previously described normal mode or the previously described outside voltage mode OVM. In particular, in the outside voltage mode OVM, the selective high voltage generator 111_b generates the pass voltage Vpass using the external high voltage Ext_Vpp. On the other hand, in the normal mode, the selective high voltage generator 111_b generates the pass voltage Vpass using a power supply voltage Vdd.

Referring to FIGS. 5 and 6, it is assumed that the external high voltage Ext_Vpp is transferred to the selective high voltage generator 111_b at least during a time period in which the outside voltage mode signal OVMS is active (e.g., logic high).

At time t1, the outside voltage mode signal OVMS becomes active (e.g., logic high), for example, according to a value set in the set register 1225 (FIG. 2). As a result, the switching circuit 111_b5 switches on (i.e., closes) to couple the external high voltage Ext_Vpp to the voltage division circuit 111_b6 along a first path. At the same time, the oscillator 111_b1 of the pumping circuit 111_b4 is deactivated (or turned off), thus shutting down functionality of the pumping circuit 111_b4. Accordingly, during the first time period T1, the voltage division circuit 111_b6 is supplied with the external high voltage Ext_Vpp having a voltage level of Vpp along the first path, and the pass voltage Vpass is generated by voltage division of the external high voltage Ext_Vpp.

At time t2, the outside voltage mode signal OVMS becomes inactive (e.g., logic low), for example, according to a value set in the set register 1225 (FIG. 2). As a result, the switching circuit 111_b5 switches off (i.e., opens) to decouple the external high voltage Ext_Vpp from the voltage division circuit 111_b6 along a first path. At the same time, the oscillator 111_b1 of the pumping circuit 111_b4 is activated (or turned on), thus activating the pumping circuit 111_b4. Accordingly, during the second time period T2, the voltage division circuit 111_b6 is supplied with an internal high voltage Int_Vpp having a voltage level of Vpp along the second path, and the pass voltage Vpass is generated by voltage division of internal high voltage Int_Vpp.

At time t3, At time t1, the outside voltage mode signal OVMS again becomes active (e.g., logic high), the switching circuit 111_b5 switches on (i.e., closes) to couple the external high voltage Ext_Vpp to the voltage division circuit 111_b6 along a first path, and the oscillator 111_b1 of the pumping circuit 111_b4 is deactivated (or turned off). Thus, the pass voltage Vpass is generated by voltage division of the external high voltage Ext_Vpp.

Figure 7:
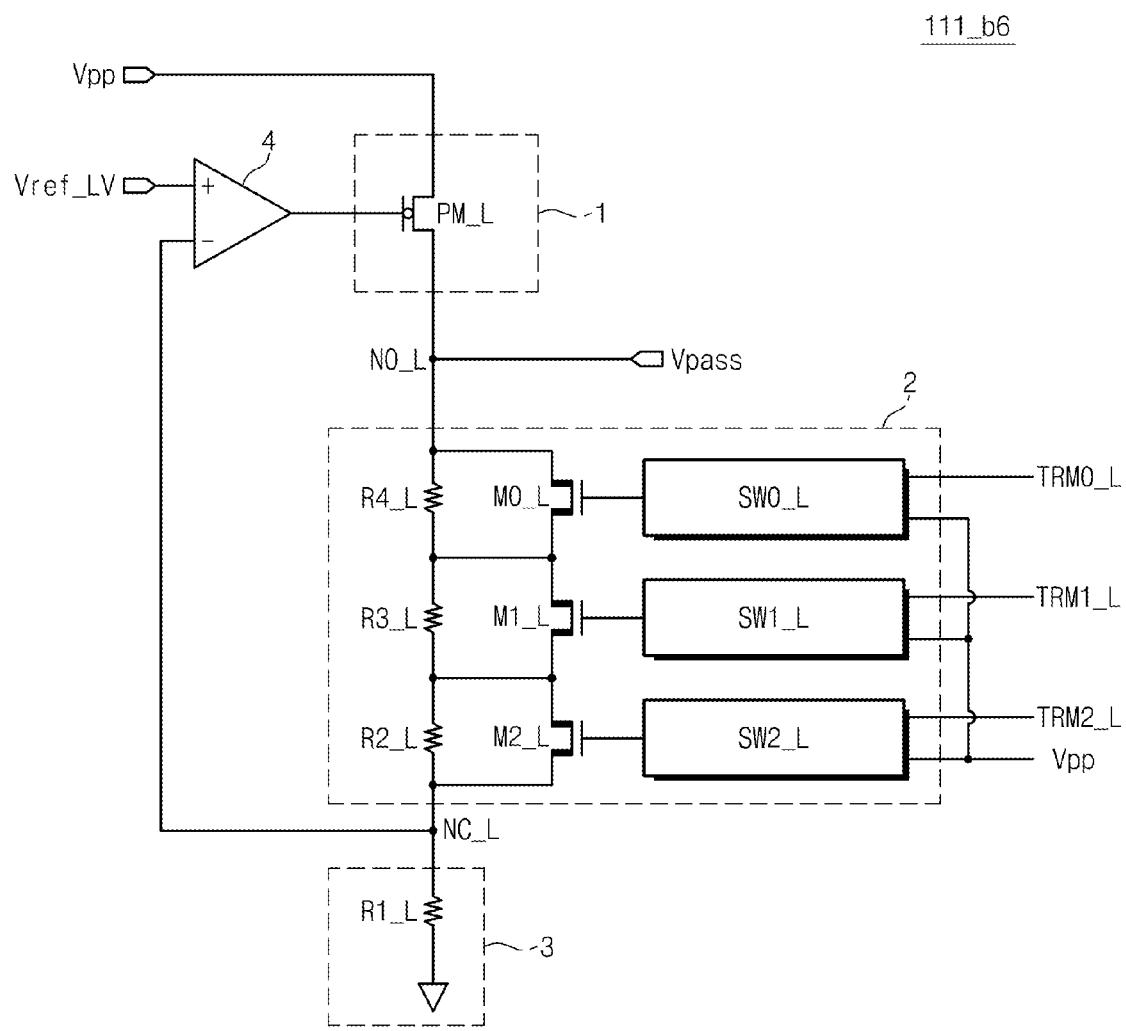
FIG. 7 is a circuit diagram of a voltage division circuit shown in FIG. 5 according to one or more embodiments of the inventive concepts.

FIG. 7 is a circuit diagram showing an example a voltage division circuit 111_b6 shown FIG. 5. Referring to FIG. 7, the voltage division circuit 111_b6 includes a power supplying unit 1, a voltage dividing unit 2, a bias current unit 3, and a comparison unit 4.

The power supplying unit 1 receives a voltage (i.e., an external high voltage Ext_Vpp or an internal high voltage Int_Vpp) of a Vpp level provided via a first path or a second path (refer to FIG. 5). The power supplying unit 1 of this example includes a PMOS transistor PM_L.

The voltage dividing unit 2 is connected between an output node NO_L and a comparison node NC_L, and outputs a pass voltage Vpass by dividing a Vpp voltage according to a trim code TRMi_L.

The voltage dividing unit 2 of this example includes a plurality of resistors R2_L to R4_L connected in series between the output node NO_L and the comparison node NC_L; transistors M0_L to M2_L connected in parallel with corresponding resistors R4_L to R2_L, respectively; and switches SW0_L~SW2_L connected to gates of corresponding transistors M0_L to M2_L, respectively. Each of the resistors R4_L to R2_L can be shorted or opened according to the trim code TRM0_L to TRM2_L. In FIG. 7, three resistors R4_L to R2_L capable of being shorted according to the trim code TRM0_L to TRM2_L are exemplarily illustrated. However, the inventive concepts are not limited thereto. That is, the voltage dividing unit 2 may include one or multiple resistors capable of being shorted according to at least one trim code.

Each of the switches SW0_L~SW2_L receives a high voltage Vpp and a corresponding one of the trim code TRM0_L to TRM2_L, and supplies a gate of a corresponding transistor with the high voltage Vpp according to the corresponding trim code.

The bias current unit 3 is connected between the comparison node NC_L and a ground terminal, and drains a constant current upon activation of the voltage division circuit 111_b6. The bias current unit 3 of this example includes a resistor R1_L.

The comparison unit 4 controls activation of the power supplying unit 1 by comparing a voltage of the comparison node NC_L and a reference voltage Vref_LV for a low voltage. For example, the comparison unit 4 continues to activate the power supplying unit 1 when a voltage of the comparison node NC_L is not identical to the reference voltage Vref_LV for a low voltage. The comparison unit 4 of this example includes a positive input terminal receiving a voltage of the comparison node NC_L and a negative input terminal receiving the reference voltage Vref_LV for a low voltage.

Figure 8:
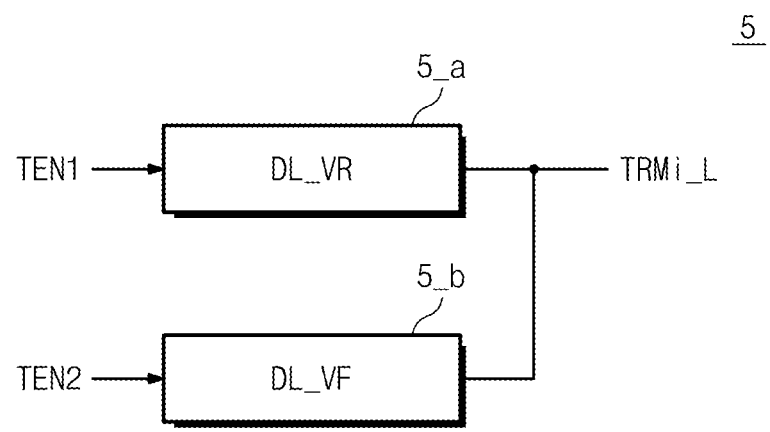
FIG. 8 is a block diagram of a trim code generator according to one or more embodiments of the inventive concepts.

FIG. 8 is a block diagram showing an example of a trim code generator 5. The trim code generator 5 generates a trim code which is applied to a voltage division circuit 111_b6 in FIG. 7. The trim code generator 5 of this example includes a first data latch 5_a and a second data latch 5_b.

For convenience of explanation, it is assumed that the first data latch 5_a latches data on a pass voltage Vpass and the second data latch 5_b latches data on a read pass voltage Vread. In order to obtain a target pass voltage Vpass from a voltage division circuit 111_b6 in FIG. 7, the first data latch 5_a outputs latched data as an ith trim code TRMi_L (i being an integer of 1 or more) in response to a first trim code enable signal TEN1. On the other hand, in order to obtain a target read pass voltage Vread from the voltage division circuit 111_b6 in FIG. 7, the second data latch 5_b outputs latched data as an ith trim code TRMi_L in response to a second trim code enable signal TEN2.

Figure 9:
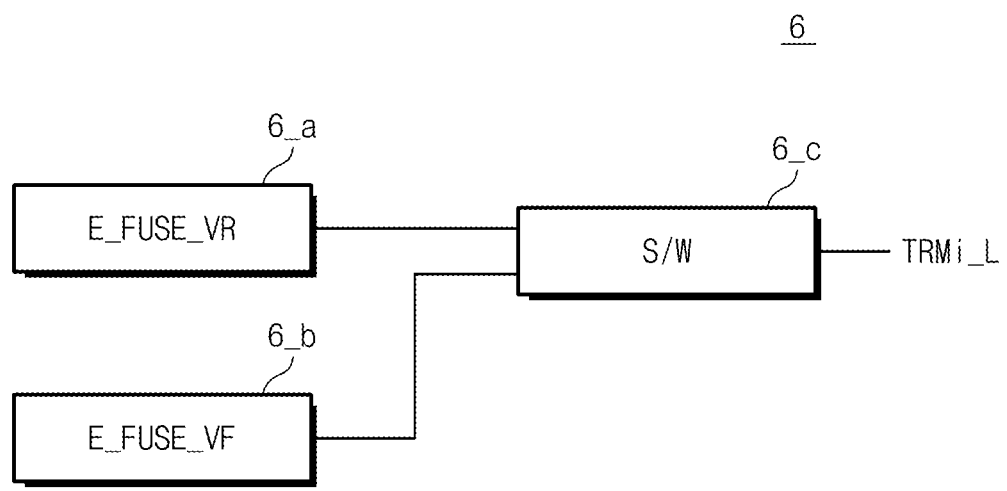
FIG. 9 is a block diagram of another trim code generator according to one or more embodiments of the inventive concepts.

FIG. 9 is a block diagram showing another example of a trim code generator 6. The trim code generator 6 generates a trim code which is applied to a voltage division circuit 111_b6 in FIG. 7. Referring to FIG. 9, a trim code generator 6 of this example includes a first E-fuse 6_a, a second E-fuse 6_b, and a switch 6_c.

For convenience of explanation, it is assumed that the first E-fuse 6_a includes an E-fuse value corresponding to a pass voltage Vpass and the second E-fuse 6_b includes an E-fuse value corresponding to a read pass voltage Vread. In order to obtain a target pass voltage Vpass from a voltage division circuit 111_b6 in FIG. 7, the switch 6_c outputs data corresponding to an E-fuse value of the first E-fuse 6_a as an ith trim code TRMi_L (i being an integer of 1 or more). On the other hand, in order to obtain a target read pass voltage Vread from the voltage division circuit 111_b6 in FIG. 7, the switch 6_c outputs data corresponding to an E-fuse value of the second E-fuse 6_b as an ith trim code TRMi_L.

Figure 10:
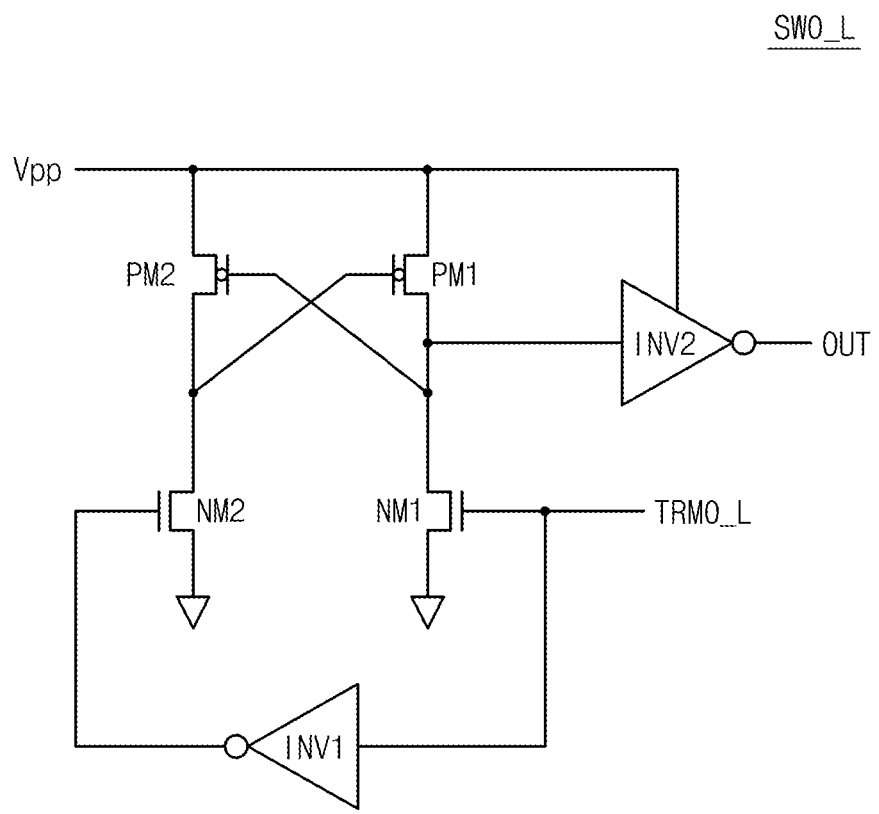
FIG. 10 is a circuit diagram of one of the switches shown in FIG. 7 according to one or more embodiments of the inventive concepts.

FIG. 10 is a circuit diagram showing an example of one of switches SW0_L shown in FIG. 7. Referring to FIG. 10, the switch SW0_L of this example includes first and second PMOS transistors PM1 and PM2, first and second NMOS transistors NM1 and NM2, and first and second inverters INV1 and INV2. The switch SW0_L is a level shifter for converting a level of a trim code TRM0_L into a level of a high voltage Vpp. Herein, the trim code TRM0_L has a level of a power supply voltage Vdd, which is lower than that of the high voltage Vpp. The remaining switches SW1_L and SW2_L shown in FIG. 7 may be substantially identical to that shown in FIG. 10.

The selective high voltage generator 111_b (FIG. 3) described above in connection with FIGS. 5 to 10 is only exemplary, and may be modified or redesigned without departing from the inventive concepts. By way of example, another embodiment of the selective high voltage generator 111_b will now be described with reference to FIG. 11.

Figure 11:
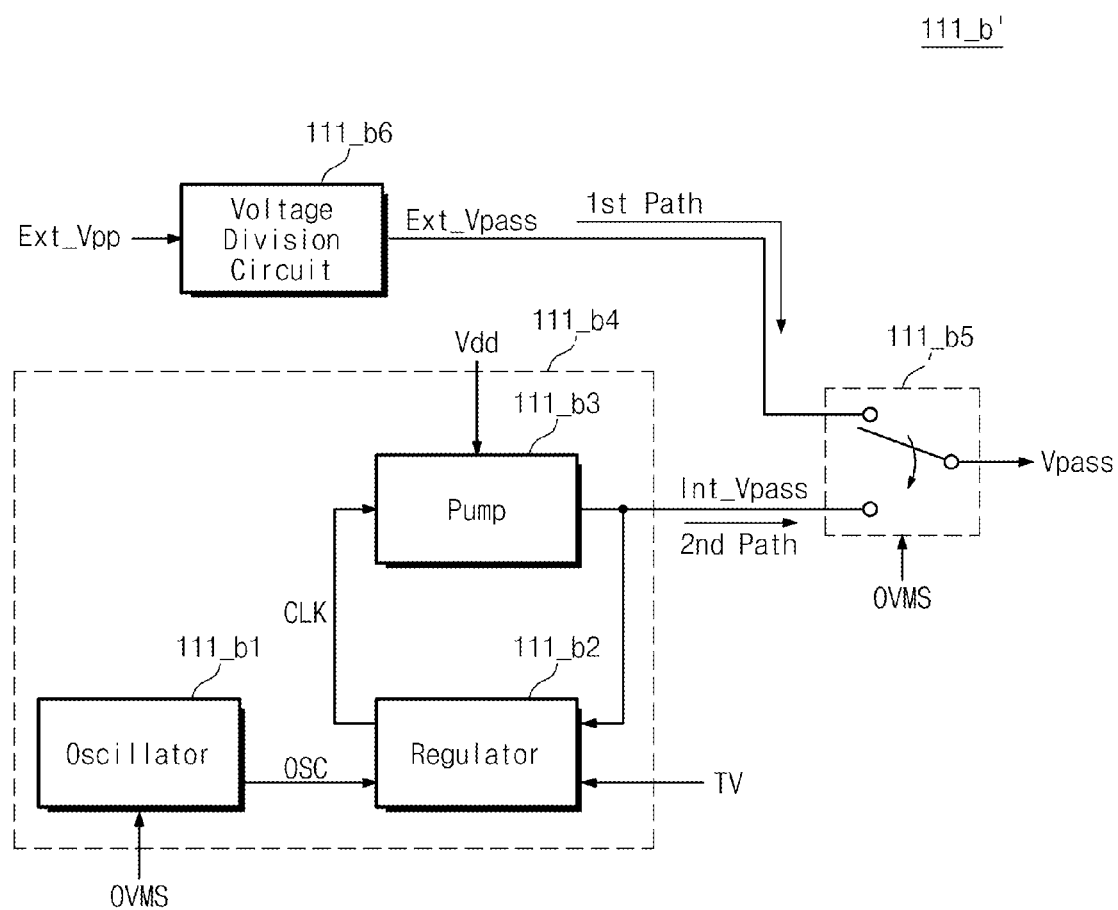
FIG. 11 is a circuit diagram of a selective high voltage generator shown in FIG. 3 according to one or more embodiments of the inventive concepts.

FIG. 11 is a circuit diagram of another example of a selective high voltage generator 111_b'. It will be apparent that the selective high voltage generator 111_b' shown in FIG. 11 is similar to that shown in FIG. 5, except that the first path voltage is Ext_Vpass obtained by voltage division of the external high voltage Ext_VPP, and the switching circuit 111_b5 selects between the first and second paths having Ext_Vpass and Int_Vpass, respectively. In the description of FIG. 11 that, constituent elements which are identical to those shown in FIG. 5 are represented by the same reference numerals and an operational description thereof is thus omitted.

Referring to FIG. 11, a selective high voltage generator 111_b' includes an oscillator 111_b1, a regulator 111_b2, a charge pump 111_b3, a switching circuit 111_b5, and a voltage division circuit 111_b6. The oscillator 111_b1, the regulator 111_b2, and the charge pump 111_b3 constitute a pumping circuit 111_b4. In this example, the pumping circuit 111_b4 can further include a voltage division circuit (not shown) for generating an internal pass voltage Int_Vpass at an output stage of the charge pump 111_b3.

In the outside voltage mode OVM, the outside voltage mode signal OVMS is active, and thus the switching circuit 111_b5 couples the output to the first path, whereby Ext_Vpass is output as the pass voltage Vpass. During this time, the oscillator 111_b1 may be deactivated, to thereby deactivate the charge pump 111_b3. In the normal mode, the outside mode signal OVMS is inactive, and thus the switching circuit 111_b5 couples the output to the second path, whereby Int_Vpass is output as the pass voltage Vpass. During this time, the oscillator 111_b1 activated, to thereby activate the charge pump 111_b3.

Figure 12:
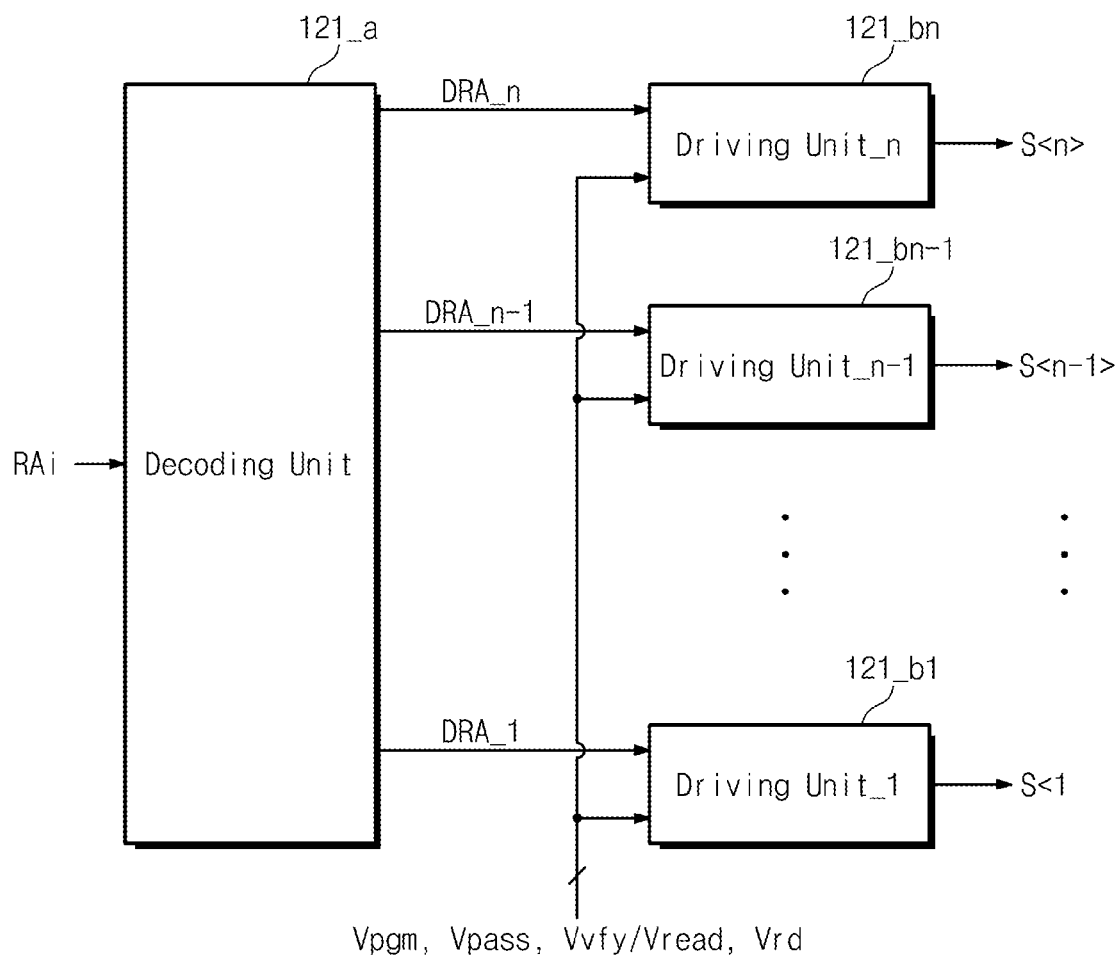
FIG. 12 is a block diagram of a voltage selection switch shown in FIG. 3 according to one or more embodiments of the inventive concepts.

FIG. 12 is a block diagram showing an example of a voltage selection switch 121 shown in FIG. 3. Referring to FIG. 12, the voltage selection switch 121 of this example includes a decoding unit 121_a and a plurality of driving units 121_b1 to 121_bn.

The decoding unit 121_a decodes a row address RAi to generate decoded row addresses DRA_1 to DRA_n. The decoding unit 121_a transfers the decoded row addresses DRA_1 to DRA_n to a corresponding driving unit among the plurality of driving units 121_b1 to 121_bn, respectively.

During a program execution period of a program operation, the plurality of driving units 121_b1 to 121_bn receives a program voltage Vpgm and a pass voltage Vpass from a voltage generation circuit 110 in FIG. 3. The plurality of driving units 121_b1 to 121_bn activate one of selection signals S<1> to S<n> in response to the decoded row addresses. One driving unit corresponding to the activated selection signal among the plurality of driving units 121_b1 to 121_bn drives the activated selection signal with the program voltage Vpgm. The remaining driving units drive inactivated (or, remaining) selection signals with the pass voltage Vpass, respectively.

During a verification read operation of a program operation or during a read operation, the plurality of driving units 121_b1 to 121_bn receives a verification read voltage Vvfy, a read pass voltage Vread, and a read voltage Vrd from the voltage generation circuit 110. The plurality of driving units 121_b1 to 121_bn activate one of selection signals S<1> to S<n> in response to the decoded row addresses. One driving unit corresponding to the activated selection signal among the plurality of driving units 121_b1 to 121_bn drives the activated selection signal with the read voltage Vrd or the verification read voltage Vvfy. The remaining driving units drive inactivated (or, remaining) selection signals with the read pass voltage Vread, respectively.

Meanwhile, the selection signals S<1> to S<n> generated from the voltage selection switch 121 are provided to row decoders 122 and 123. This will be more fully described with reference to FIG. 13.

Figure 13:
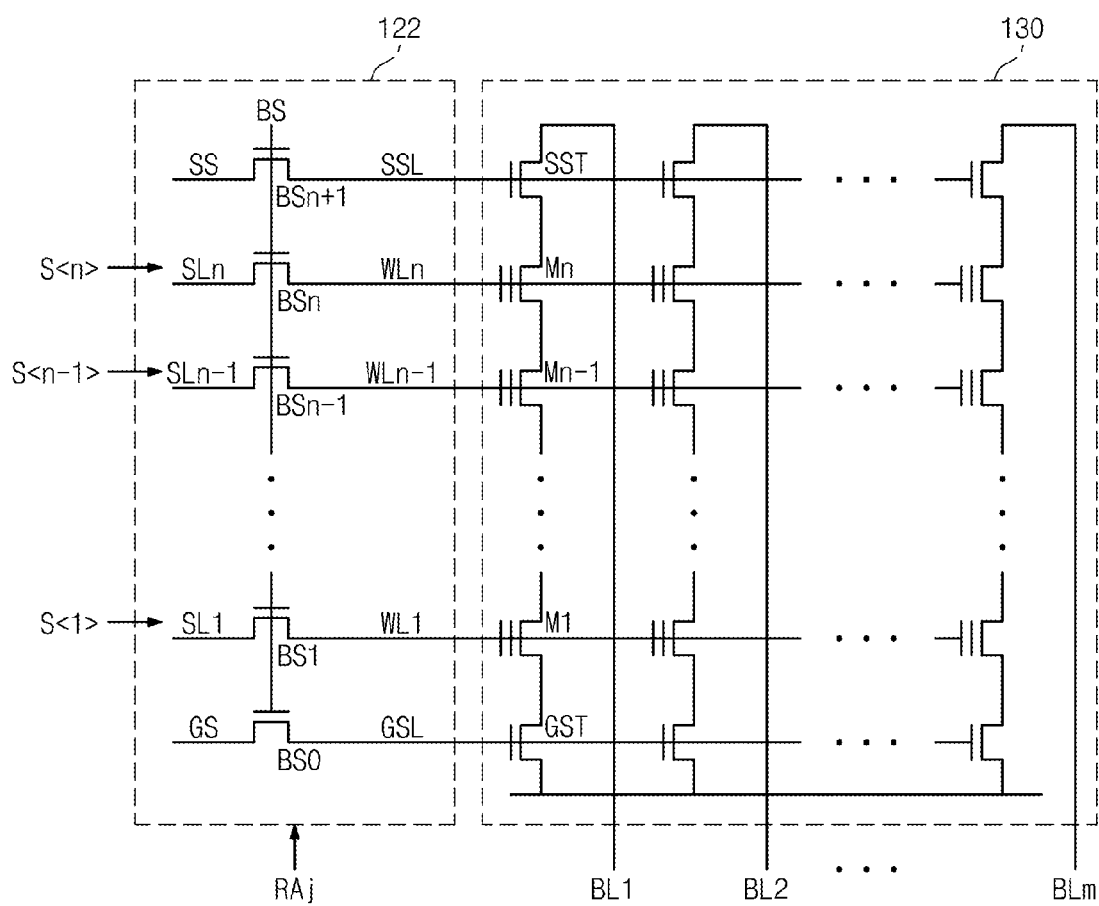
FIG. 13 is a block diagram of a row decoder and a memory cell array shown in FIG. 3 according to one or more embodiments of the inventive concepts.

FIG. 13 is a block diagram showing examples of a row decoder 122 and a memory cell array 130 shown in FIG. 3. The memory cell array 130 includes a plurality of memory blocks. For convenience of explanation, one memory block and a row decoder 122 corresponding to the one memory block are exemplarily illustrated in FIG. 13.

Referring to FIG. 13, the row decoder 122 selects a memory block in response to a row address RAj. That is, the row decoder 122 activates a block control signal BS corresponding to the row address RAj, and voltage transfer transistors BS0 to BSn+1 are turned on or off by the block control signal BS. When the voltage transfer transistors BS0 to BSn+1 are turned on, selection signal lines SL1 to SLn are electrically connected with word lines WL1 to WLn, respectively. Accordingly, the voltages on selection signals S<1> to S<n> are provided to the word lines WL1 to WLn, respectively.

For example, during a program execution period of a program operation, a program voltage Vpgm on an activated selection signal is provided to a selected word line, and a pass voltage Vpass on non-activated selection signals is provided to unselected word lines, respectively. As another example, during a read operation or during a verification read period of a program operation, a read voltage Vrd or a verification read voltage Vvfy on an activated selection signal is provided to a selected word line, and a read pass voltage Vread on non-activated selection signals is provided to unselected word lines, respectively.

A memory block of the memory cell array 130 of this example includes a plurality of strings each corresponding to a plurality of bit lines BL1 to BLm. Each string includes a string selection transistor SST, a ground selection transistor GST, and memory cells M1 to Mn connected in series between the selection transistors GST and SST. The memory cells M1 to Mn in each string are connected with corresponding word lines WL1 to WLn, respectively. That is, memory cells (e.g., M1) in the same row are connected in common with a corresponding word line (e.g., WL1).

During a program execution period of a program operation, memory cells connected with a selected word line are supplied with a program voltage Vpgm via the selected word line, and memory cells connected with unselected word lines are supplied with a pass voltage Vpass via the unselected word lines. During a read operation or during a verification read period of a program operation, memory cells connected with a selected word line are supplied with a read voltage Vrd or a verification read voltage Vvfy via the selected word line, and memory cells connected with unselected word lines are supplied with a read pass voltage Vread via the unselected word lines.

Other embodiments of the inventive concepts will now be described with reference to FIGS. 14 to 17.

Figure 14:
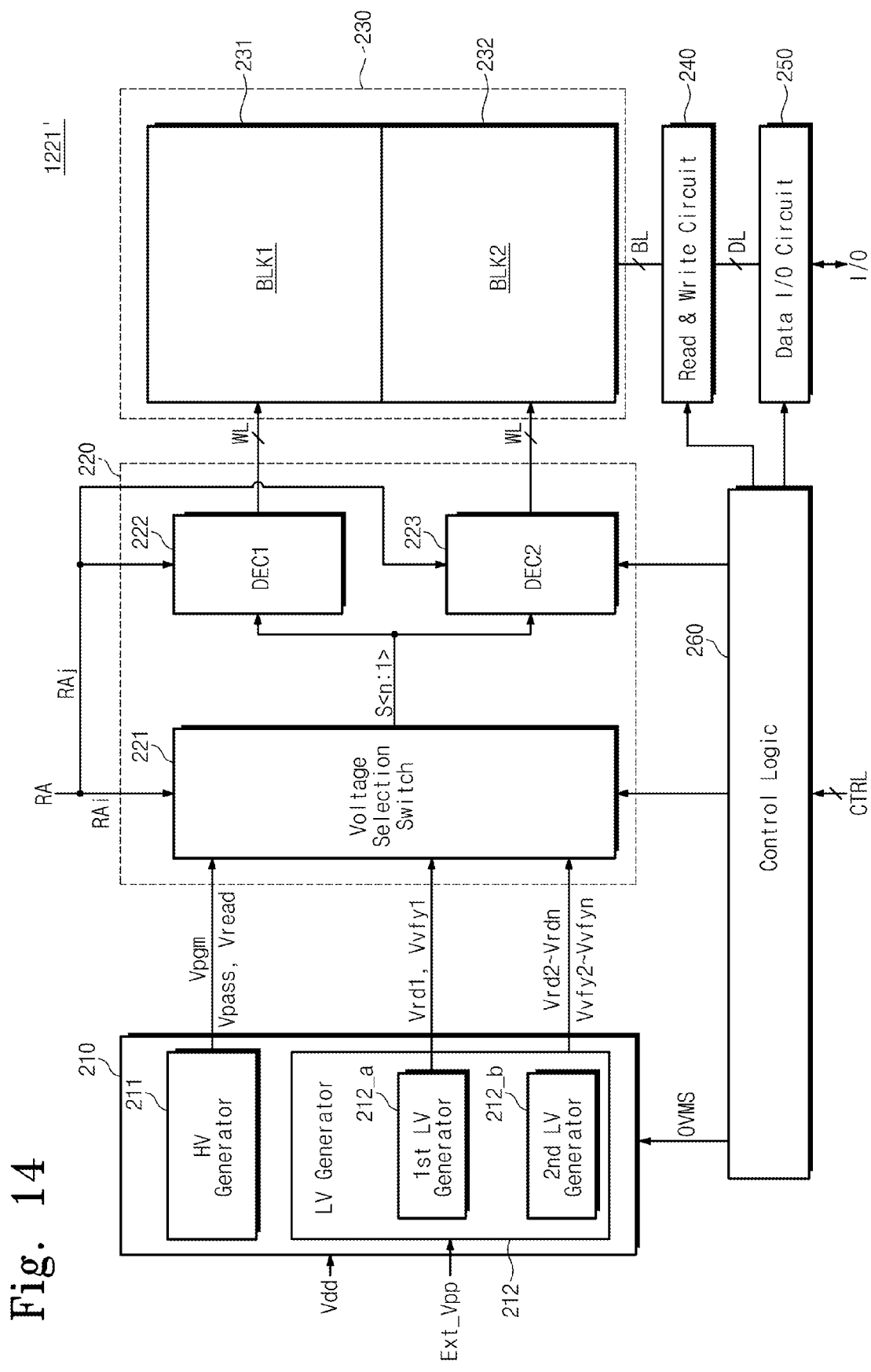
FIG. 14 is a block diagram of a non-volatile memory device according to one or more other embodiments of the inventive concepts.

FIG. 14 is a block diagram of a non-volatile memory device according to another exemplary embodiment of the inventive concepts. The non-volatile memory device 1221' shown in FIG. 14 supports an outside voltage mode OVM, and generates a low voltage (e.g., a read voltage Vrd or a verification read voltage Vvfy) to be supplied to a selected word line using an external high voltage Ext_Vpp.

Except for the voltage generation circuit 210, the non-volatile memory device 1221' shown in FIG. 14 includes like-named elements shown in previously described FIG. 3, and accordingly, a detailed description of those elements is omitted below to avoid redundancy in the description.

Referring to FIG. 14, the non-volatile memory device 1221' includes the voltage generation circuit 210, a row selection circuit 220, a memory cell array 230, a read and write circuit 240, a data input/output circuit 250, and control logic 260.

The voltage generation circuit 210 generates voltages (i.e., word line voltages) to be provided to word lines WL of the memory cell array 230. The example embodiment of FIG. 14 is at least partially characterized by the voltage generation circuit 210 generating a read voltage Vrd and/or a verification read voltage Vvfy to be supplied to a selected word line using an external high voltage Ext_Vpp in response to an outside voltage mode signal OVMS. The voltage generation circuit 210 includes a high voltage generator 211 and a low voltage generator 212.

The high voltage generator 211 generates a program voltage Vpgm, a pass voltage Vpass, and a read pass voltage Vread in response to the control of the control logic 260. In the example of this embodiment, the high voltage generator 211 generates the program voltage Vpgm, the pass voltage Vpass, and the read pass voltage Vread using a power supply voltage Vdd, regardless of whether the external high voltage Ext_Vpp is supplied. This may be accomplished, for example, by charge pumping of the power supply voltage Vdd.

The low voltage generator 212 includes a first low voltage generator 212_a and a second low voltage generator 212_b. Each of the first low voltage generator 212_a and the second low voltage generator 212_b generates a read voltage Vrd or a verification read voltage Vvfy in response to the control of the control logic 260.

The first low voltage generator 212_a generates a read voltage Vrd or a verification read voltage Vvfy using the power supply voltage Vdd. For convenience of explanation, it is assumed that the first low voltage generator 212_a generates a first read voltage Vrd1 or a first verification read voltage Vvfy1. The first read voltage Vrd1 and the first verification read voltage Vvfy1 are identical to or lower in level than the power supply voltage Vdd, for example.

The second low voltage generator 212_b generates read voltages Vrd2 to Vrdn or verification read voltages Vvfy2 to Vvfyn, which are higher in level than a predetermined voltage (e.g., the power supply voltage Vdd), in response to the control of the control logic 260. The second low voltage generator 212_b generates the read voltages Vrd2 to Vrdn or the verification read voltages Vvfy2 to Vvfyn by lowering the external high voltage Ext_Vpp in the outside voltage mode or by lowering an internal high voltage Int_Vpp in the normal mode.

In particular, if the external high voltage Ext_Vpp is supplied, the second low voltage generator 212_b lowers the external high voltage Ext_Vpp in response to an outside voltage mode signal OVMS to generate the read voltages Vrd2 to Vrdn or the verification read voltages Vvfy2 to Vvfyn to be supplied to a selected word line. In this case, the read voltages Vrd2 to Vrdn and the verification read voltages Vvfy2 to Vvfyn are higher in level than the power supply voltage Vdd.

In the event that the external high voltage Ext_Vpp is not supplied, the second low voltage generator 212_b divides the internal high voltage Int_Vpp (refer to FIG. 5) to generate the read voltages Vrd2 to Vrdn or the verification read voltages Vvfy2 to Vvfyn. In this case, the internal high voltage Int_Vpp is transferred from the high voltage generator 211, and has a Vpp voltage level which is the same as the external high voltage Ext_Vpp. The high voltage generator 211 for generating the internal high voltage Int_Vpp may be the same as a normal high voltage generator 111_a shown in previously described FIG. 4 and the pumping circuit 111_b4 shown in previously described FIG. 5.

Figure 15:
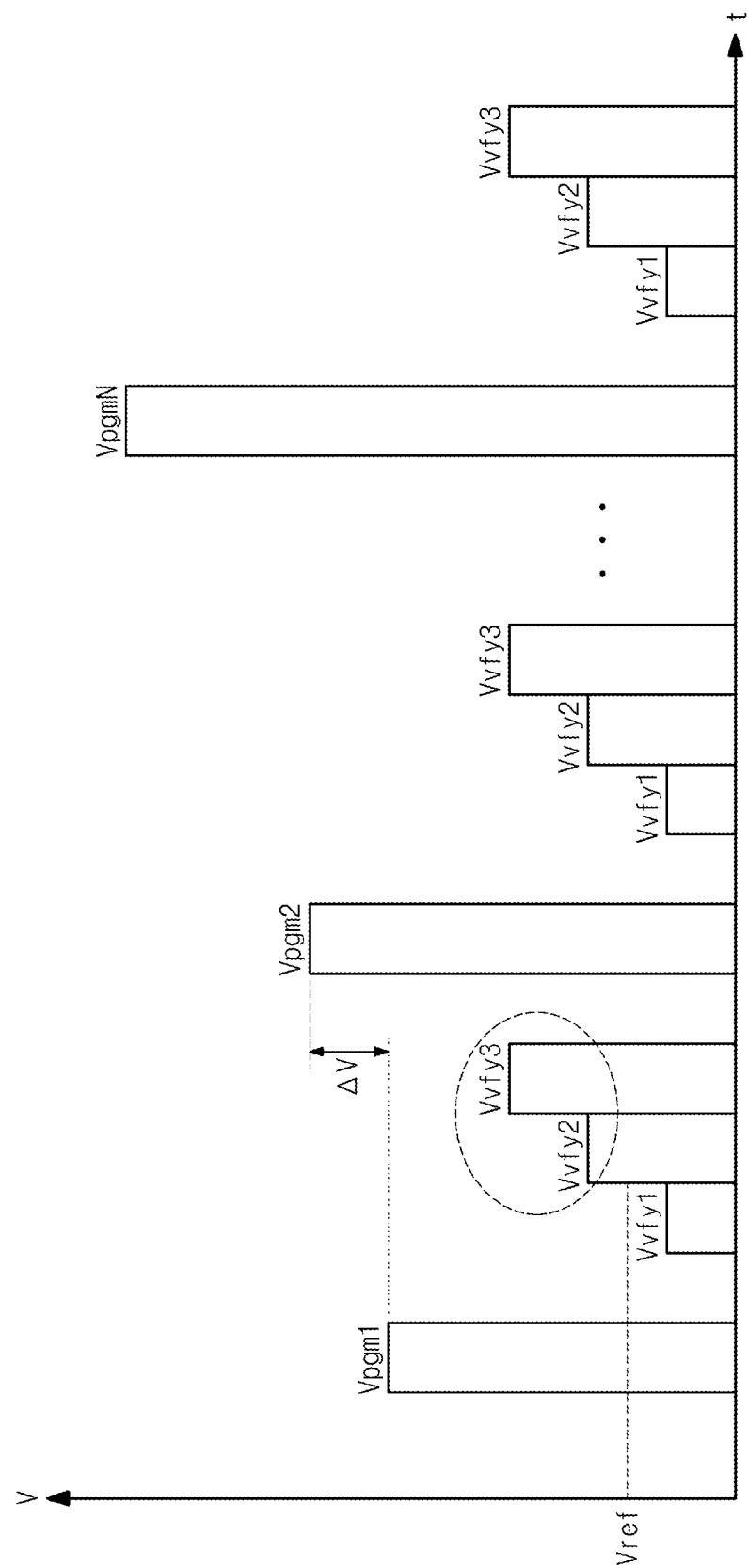
FIGS. 15 and 16 are diagrams for describing an operational example of a voltage generation circuit shown in FIG. 14.
Figure 16:
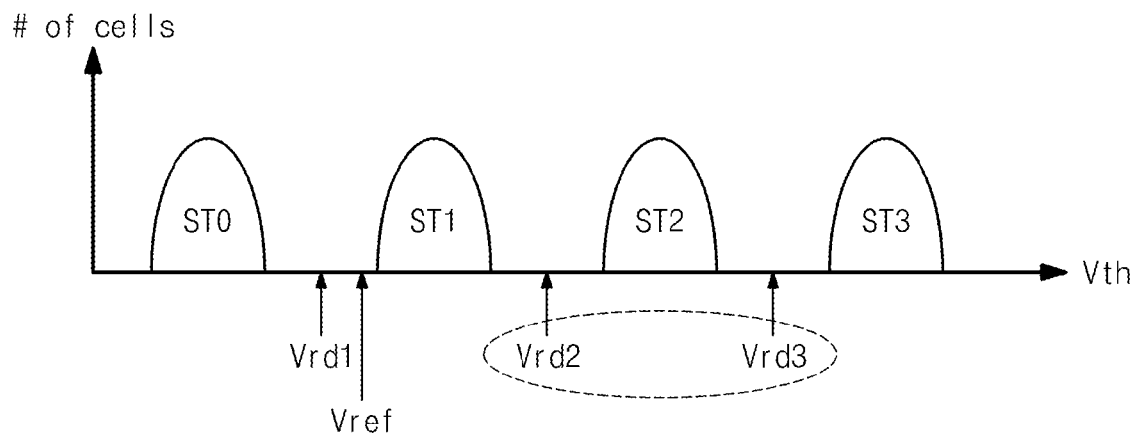

FIGS. 15 and 16 are diagrams for describing an operation of the voltage generation circuit shown in FIG. 14. FIG. 15 shows voltage levels of verification read voltages Vvfy1 to Vvfy3 during a verification read period which is executed within a program operation, and FIG. 16 shows voltage levels of read voltages Vrd1 to Vrd3 according to threshold voltage distributions of memory cells.

Referring to FIG. 15, a non-volatile memory device 1221' shown in FIG. 14 performs a program operation according to an incremental step pulse programming (ISPP) technique. Exemplarily, a verification read period is performed using three verification read voltages Vvfy1 to Vvfy3. However, the number of verification read voltages is not limited thereto, and is may be set variously, particularly depending on the number of bits stored in each memory cell.

In a case where a verification read period is performed using three verification read voltages Vvfy1 to Vvfy3, as illustrated in the example of FIG. 15, a first verification read voltage Vvfy1 is lower in level than a reference voltage Vref, and second and third verification read voltages Vvfy2 and Vvfy3 are higher in level than the reference voltage Vref. In this example, the reference voltage Vref is identical to or similar to the power supply voltage Vdd.

In this case, a low voltage generator 212 in FIG. 14 generates a verification read voltage Vvfy1 which is lower than the reference voltage Vref using the power supply voltage Vdd, and generates verification read voltages Vvfy2 and Vvfy3 which are higher than the reference voltage Vref using the external high voltage Ext_Vpp.

For example, a first low voltage generator 212_a of the low voltage generator 212 generates the first verification read voltage Vvfy1 by outputting the power supply voltage Vdd as the first verification read voltage Vvfy1. The second low voltage generator 212_b of the low voltage generator 212 generates the second and third verification read voltages Vvfy2 and Vvfy3 by lowering the external high voltage Ext_Vpp. If the external high voltage Ext_Vpp is not supplied, the second low voltage generator 212_b of the low voltage generator 212 generates the second and third verification read voltages Vvfy2 and Vvfy3 by lowering the internal high voltage Int_Vpp Referring to FIG. 16, memory cells of a memory cell array 230 in FIG. 4 have one of four threshold voltage distributions. That is, memory cells have a threshold voltage distribution corresponding to one of an erase state ST0, a first program state ST1, a second program state ST2, and a third program state ST3. Logic states ST0 to ST3 of the memory cells and the number of the logic states ST0 to ST3 are not limited to this example.

In a case where there are four possible threshold voltage distributions per memory cell, a read operation necessitates three read voltages Vrd1, Vrd2, and Vrd3. In this case, as illustrated in the example of FIG. 16, a first read voltage Vrd1 is lower in level than the reference voltage Vref, and second and third read voltages Vrd2 and Vrd3 are higher in level than the reference voltage Vref. In this example, the reference voltage Vref is identical to or similar to the power supply voltage Vdd.

Figure 17:
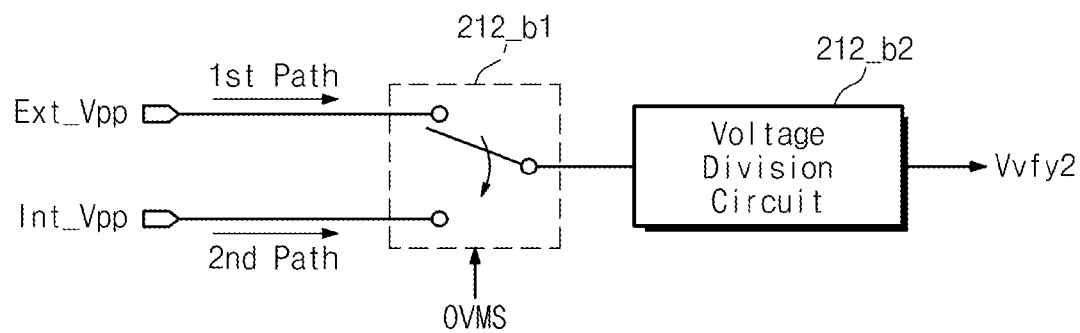
FIG. 17 is a block diagram of a second low voltage generator shown in FIG. 14 according to one or more embodiments of the inventive concepts.

In this case, the low voltage generator 212 generates a read voltage in a manner similar to the previously described operation of generating a verification read voltage. That is, the first low voltage generator 212_a of the low voltage generator 212 generates a read voltage Vrd1 which is lower in level than the reference voltage Vref using the power supply voltage Vdd. The second low voltage generator 212_b of the low voltage generator 212 generates read voltages Vrd2 and Vrd3 which is higher in level than the reference voltage Vref using the external high voltage Ext_Vpp. If the external high voltage Ext_Vpp is not supplied, the second low voltage generator 212_b of the low voltage generator 212 generates the second and third read voltages Vrd2 and Vrd3 by lowering the internal high voltage Int_Vpp FIG. 17 is a block diagram showing an example of a second low voltage generator 212_b shown in FIG. 14. As described above with reference to FIGS. 14 to 16, if an external high voltage Ext_Vpp is supplied, the second low voltage generator 212_b generates a verification read voltage or a read voltage (which is higher in level than a reference voltage Vref) using the external high voltage Ext_Vpp. Otherwise, the second low voltage generator 212_b generates a verification read voltage or a read voltage (which is higher in level than a reference voltage Vref) using the internal high voltage Int_Vpp.

As illustrated in FIG. 17, the second low voltage generator 212_b of this example includes a switching circuit 212_b1 and a voltage division circuit 212_b2.

The switching circuit 212_b1 receives the external high voltage Ext_Vpp via a first path and the internal high voltage Int_Vpp via a second path. The switching circuit 212_b1 transfers either one of the external high voltage Ext_Vpp and the internal high voltage Int_Vpp to the voltage division circuit 212_b2 in response to the outside voltage mode signal OVMS.

For example, when the outside voltage mode signal OVMS is active, the switching circuit 212_b1 receives the external high voltage Ext_Vpp via the first path and transfers the same to the voltage division circuit 212_b2. On the other hand, when the outside voltage mode signal OVMS is inactive, the switching circuit 212_b 1 receives the internal high voltage Int_Vpp via the second path and transfers the same to the voltage division circuit 212_b2. The voltage division circuit 212_b2 shown in FIG. 17 may be similar to that described previously in connection with FIGS. 7 to 10, and description thereof is thus omitted here.

As mentioned above, the internal high voltage Int_Vpp may be provided from the high voltage generator 211 shown in FIG. 14. The high voltage generator 211 may be similar to the normal high voltage generator 111_a shown in FIG. 4 and the pumping circuit 111_b4 in FIG. 5, and a description thereof is thus omitted here.

In the example described above in connection with FIGS. 14 to 17, the first low voltage generator 212_a generates one verification voltage Vvfy1 and/or one read voltage Vrd1. This is understood to be only exemplary. For example, the number of verification read voltages or read voltages generated by the first low voltage generator 212_a can be modified according to a level of the reference voltage Vref.

Figure 18:
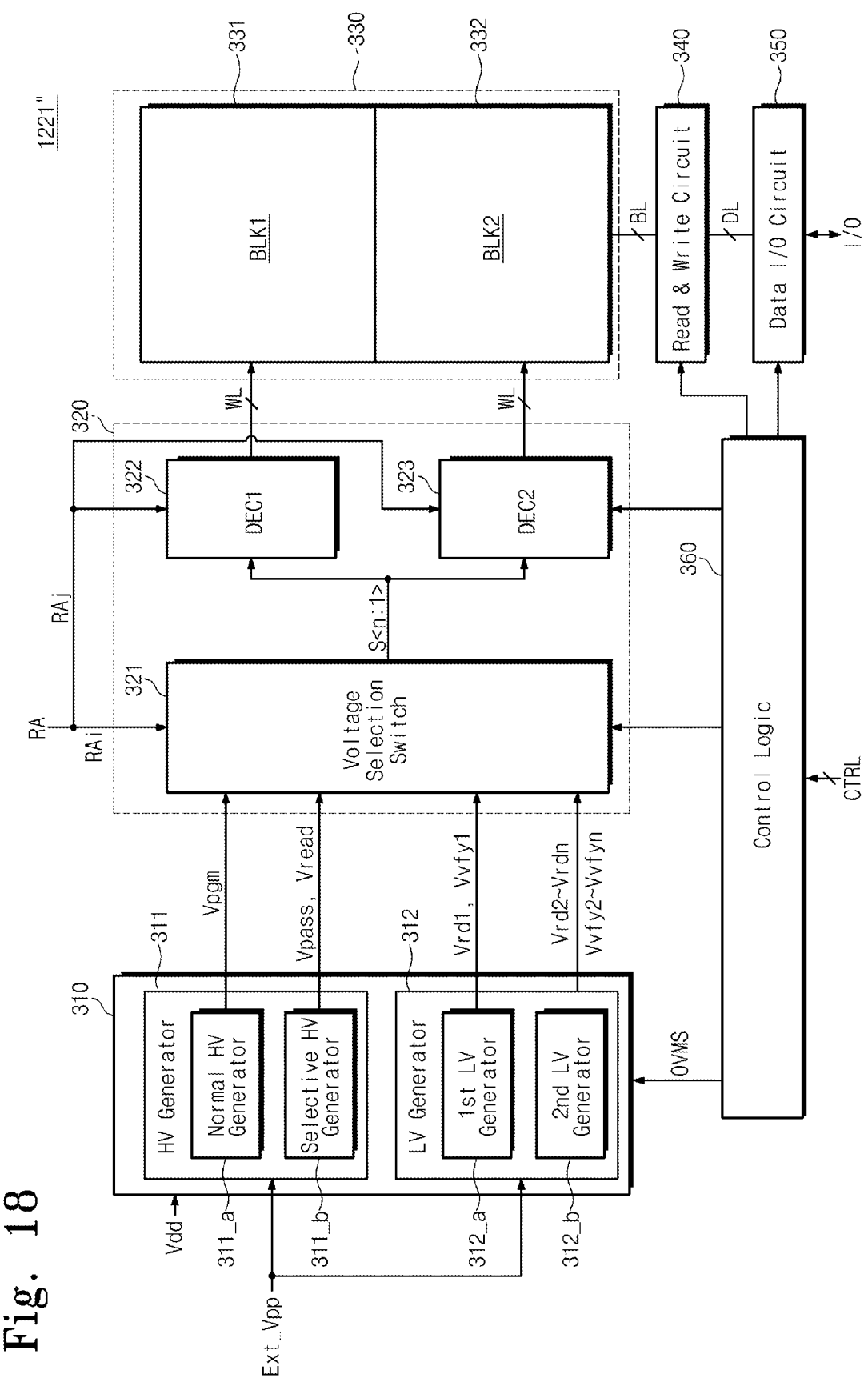
FIG. 18 is a block diagram of a non-volatile memory device according to still one or more other embodiments of the inventive concepts.

FIG. 18 is a block diagram of a non-volatile memory device according to still another exemplary embodiment of the inventive concepts. The non-volatile memory device 1221″ shown in FIG. 18 supports an outside voltage mode OVM.

Referring to FIG. 18, the non-volatile memory device 1221″ of this example includes a voltage generation circuit 310, a row selection circuit 320, a memory cell array 330, a read and write circuit 340, a data input/output circuit 350, and control logic 360. Except for the voltage generation circuit 310, the non-volatile memory device 1221″ shown in FIG. 18 includes the same like-named elements shown in previously described FIG. 3, and accordingly, a detailed description of those elements is omitted below to avoid redundancy in the description.

The voltage generation circuit 310 of this example includes a high voltage generator 311 and a low voltage generator 312. The high voltage generator 311 includes a normal high voltage generator 311_a and a selective high voltage generator 311_b, and the low voltage generator 312 includes a first low voltage generator 312_a and a second low voltage generator 312_b.

In a case where an external high voltage Ext_Vpp is provided, the selective high voltage generator 311_b generates a pass voltage Vpass or a read pass voltage Vread using the external high voltage Ext_Vpp. The selective high voltage generator 311_b is similar to that shown in FIG. 3, and description thereof is thus omitted here. In the meantime, the normal high voltage generator 311_a generates a program voltage Vpgm from the supply voltage Vdd. Also, in the case where the external high voltage Ext_Vpp is provided, the second low voltage generator 312_b generates read voltages Vrd2 to Vrdn or verification read voltages Vvfy2 to Vvfyn using the external high voltage Ext_Vpp. The second low voltage generator 312_b is similar to that shown in FIG. 14, and description thereof is thus omitted here. In the meantime, the first low voltage generator 312_a generates the read voltage Vrd1 or the read verification voltage Vvfy1 from the supply voltage Vdd.

In the case where the external high voltage Ext_Vpp is not supplied, then all of the generators 311_a, 311_b, 312_a and 312_b generate their respective voltages from the supply voltage Vdd.

Figure 19:
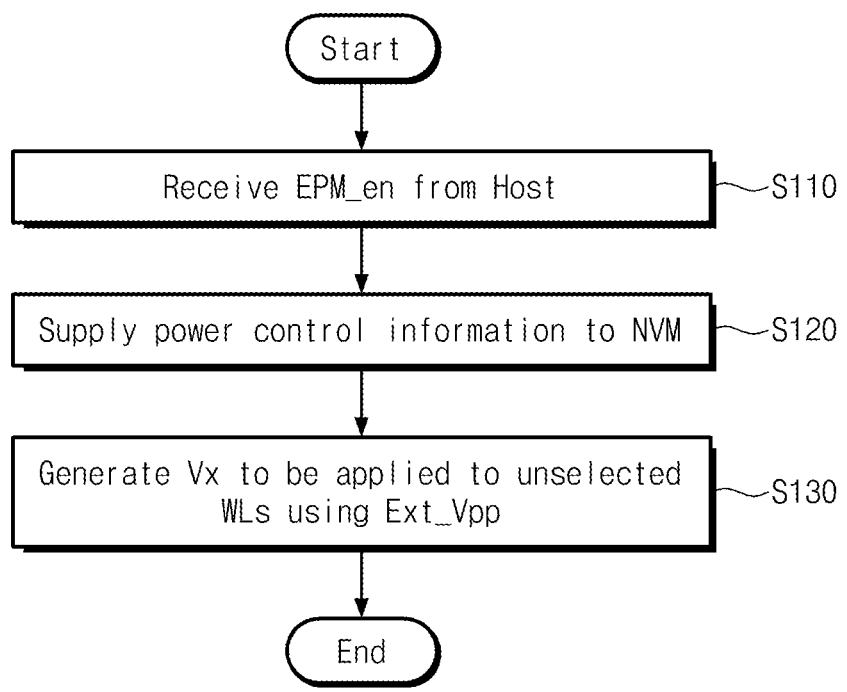
FIG. 19 is a flowchart for describing an operational example of a memory system in FIG. 1.

FIG. 19 is a flowchart for describing an operation of the memory system 1200 shown in FIG. 1.

In operation S110, the memory system 1200 receives an external power enable signal EPM_en from a host 1100.

In operation S120, a memory controller 1210 of the memory system 1200 provides a non-volatile memory (NVM) device with power control information, that is, a control signal and data for setting an outside voltage mode OVM in response to the external power enable signal EPM_en.

In operation S130, a non-volatile memory device set to the outside voltage mode OVM generates a voltage Vx from the external high voltage Ext_Vpp. The voltage Vx may, for example, be a pass voltage to be supplied to unselected word lines in a program operation, a read verification pass voltage to be supplied to unselected word lines in a read verification operation, or a read pass voltage to be supplied to unselected word lines in a read operation. Further, the voltage Vx may be a read voltage or a read verification voltage which is higher than a power supply voltage Vdd.

In the example described above, the memory system 1200 acquires information regarding the provision of the external high voltage Ext_Vpp via the external power enable signal EPM_en from the host 1100. However, the inventive concepts are not limited thereto. For example, the host may not support a function of providing the external power enable signal EPM_en to a memory system. The next described embodiment is adapted for this possibility.

Figure 20:
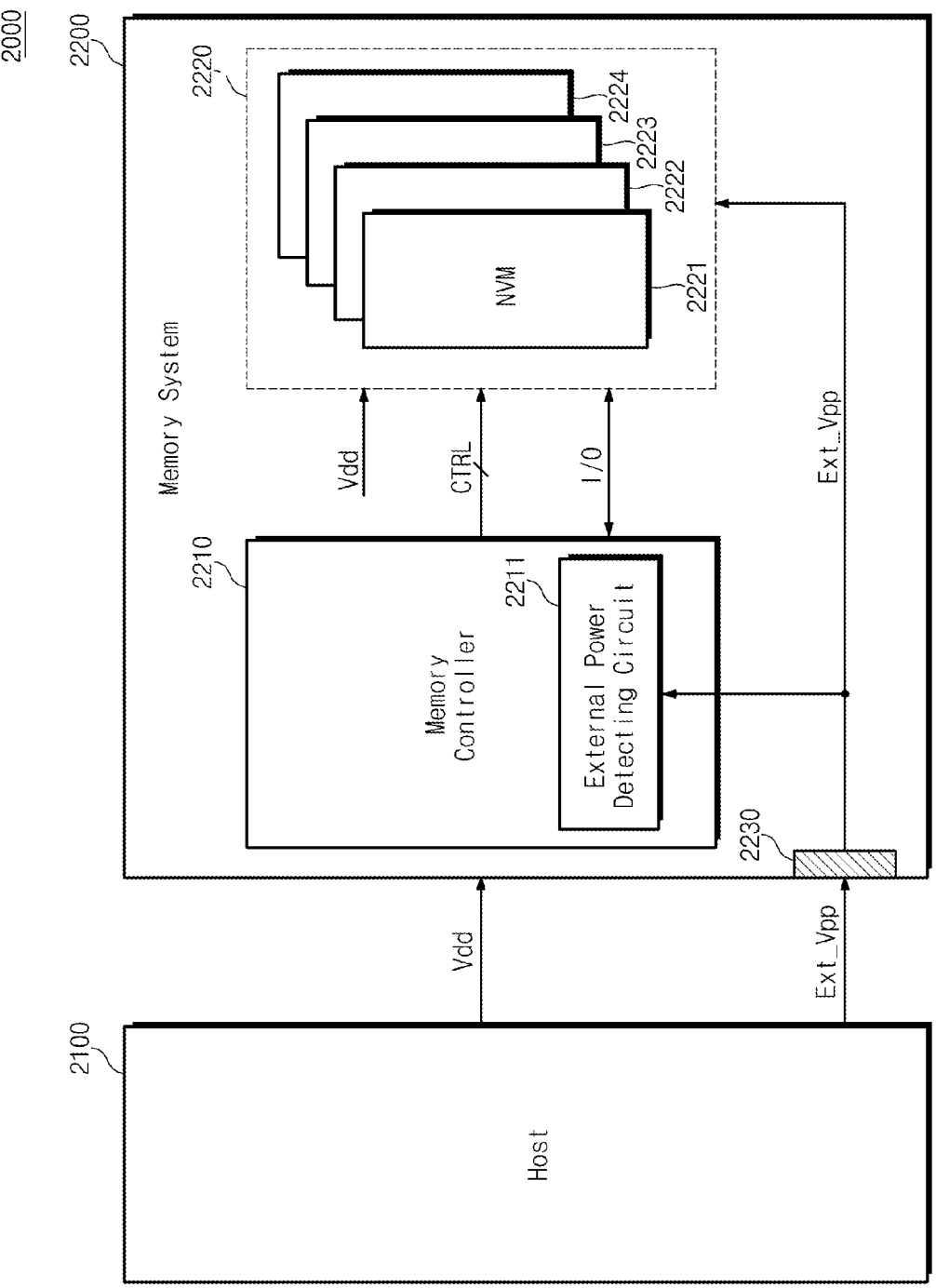
FIG. 20 is a block diagram of an electronic device according to according to one or more other embodiments of the inventive concepts.

FIG. 20 is a block diagram of an electronic device according to another exemplary embodiment of the inventive concepts. Referring to FIG. 20, an electronic device 2000 includes a host 2100 and a memory system 2200. The electronic device 2000 shown in FIG. 20 is similar to that in FIG. 1, and only differences between the two are discussed below.

The memory system 2200 includes a memory controller 2210 and a non-volatile memory part 2220. Unlike the host 1100 shown in FIG. 1, the host 2100 shown in FIG. 20 does not provide an external power enable signal EPM_en to the memory system 2200. As such, the memory system 2200 is equipped with an external power detecting circuit 2211 for detecting whether the external high voltage Ext_Vpp is received.

A pad 2230 of the memory system 2200 receives the external high voltage Ext_Vpp from the host 2100. The external high voltage Ext_Vpp received via the pad 2230 is transferred to non-volatile memory devices 2221 to 2224.

The external power detecting circuit 2211 detects whether the external high voltage Ext_Vpp is received via the pad 2230. For example, if the external high voltage Ext_Vpp is received via the pad 2230, the external power detecting circuit 2211 detects an input of the external high voltage Ext_Vpp to send a control signal and data for setting an outside voltage mode OVM to non-volatile memory devices. The non-volatile memory devices are similar to those described in connection with FIGS. 3 to 19, and description thereof is thus omitted here.

In FIG. 20, the external power detecting circuit 2211 is shown as being included within the memory controller 2210. However, the inventive concepts are not limited thereto. For example, the external power detecting circuit 2211 may be provided external the memory controller 2210 or within a non-volatile memory device (e.g., a first non-volatile memory device 2221) supporting an outside voltage mode OVM. This alternative will be more fully described with reference to FIGS. 21 and 22.

Figure 21:
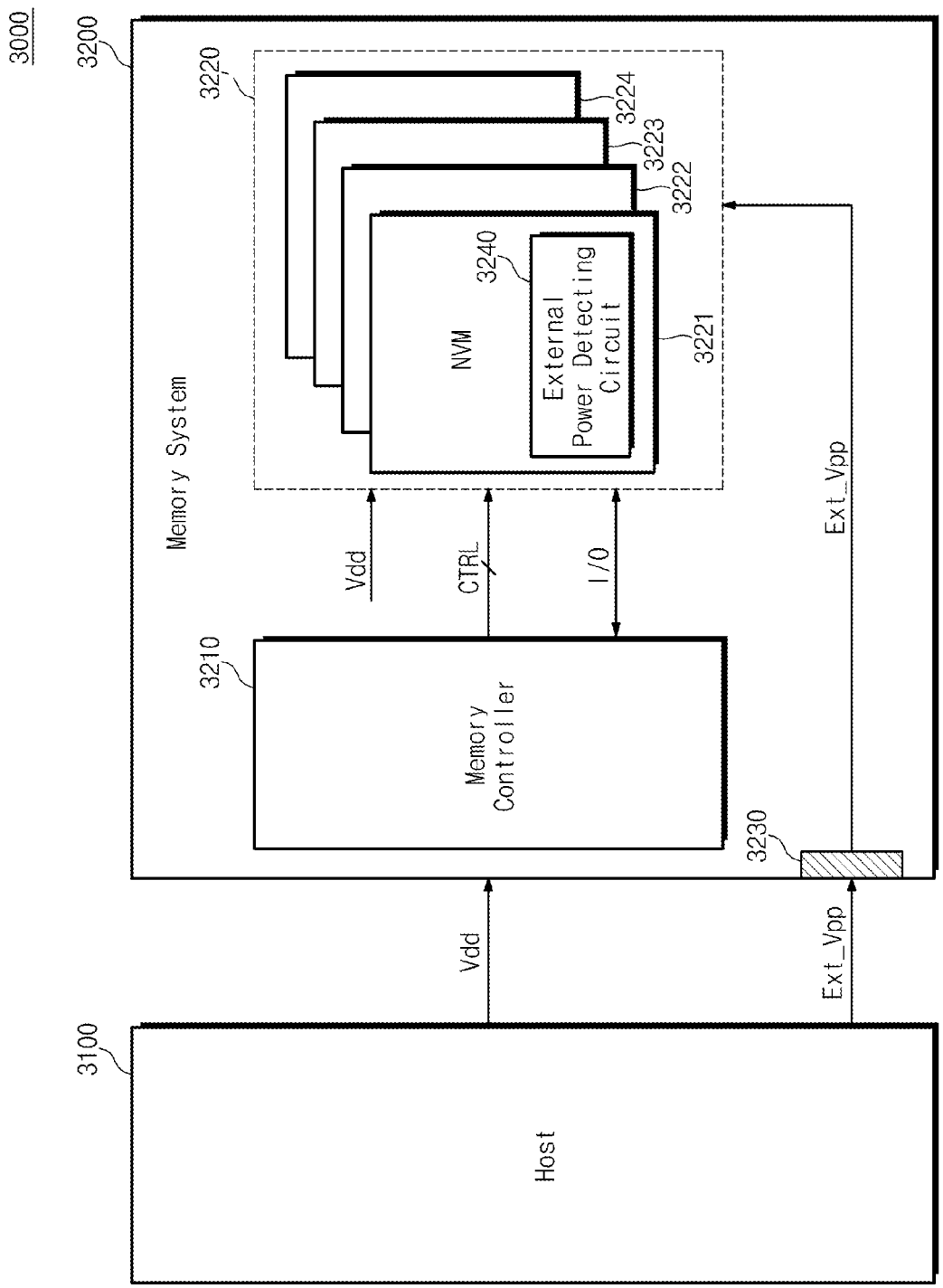
FIG. 21 is a block diagram of an electronic device according to according still to one or more other embodiments of the inventive concepts.
Figure 22:
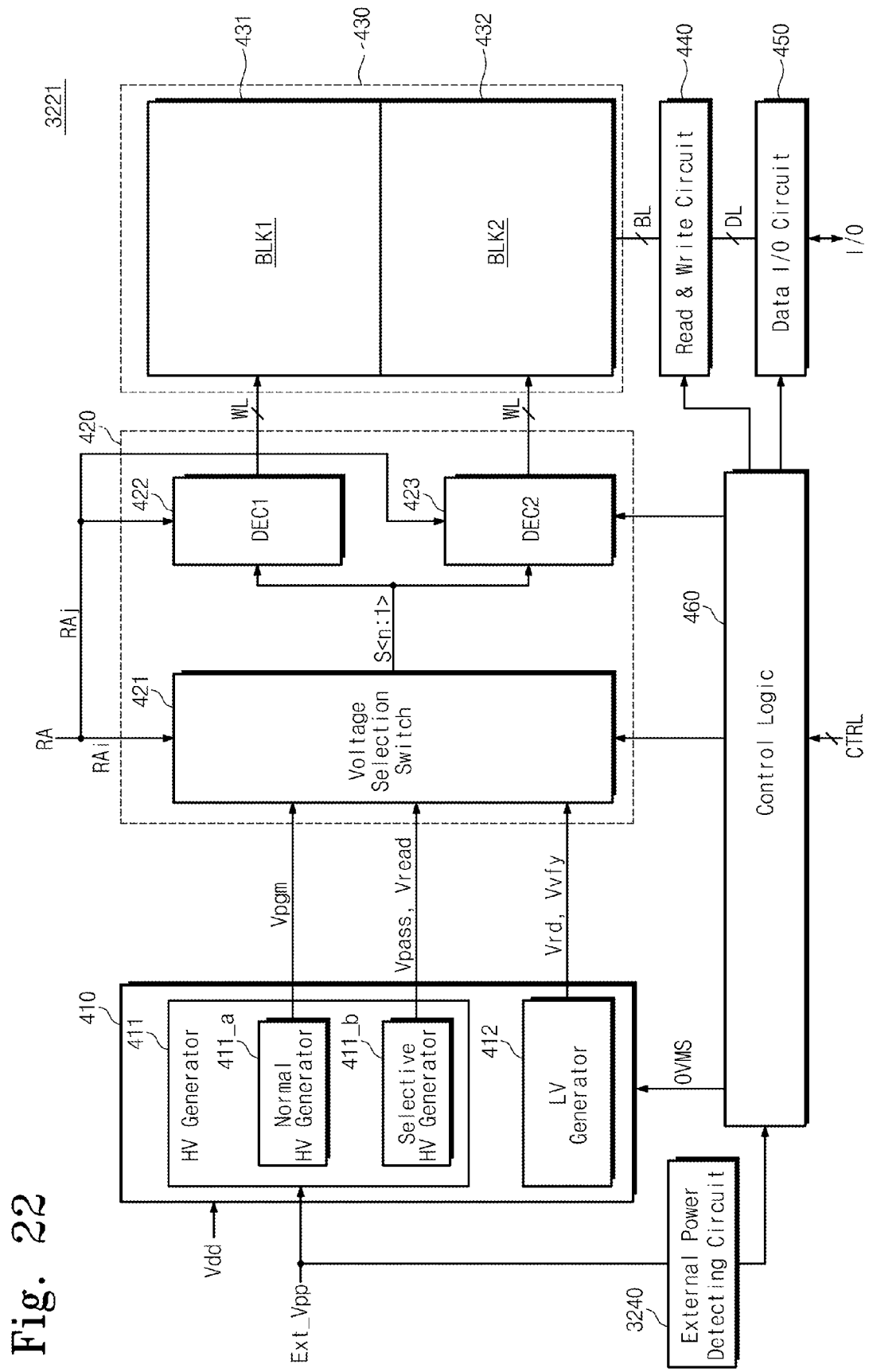
FIG. 22 is a block diagram of a non-volatile memory device shown in FIG. 21 according to one or more embodiments of the inventive concepts.

FIG. 21 is a block diagram of an electronic device 3000 according to still another exemplary embodiment of the inventive concepts. FIG. 22 is a block diagram of a non-volatile memory device 3221 shown in FIG. 21 according to an exemplary embodiment of the inventive concepts. In FIGS. 21 and 22, an external power detecting circuit 3240 is included within a first non-volatile memory device 3221 supporting an outside voltage mode OVM. The electronic device 3000 shown in FIG. 21 is similar to that in FIGS. 1 and 20, and only differences between the two are discussed below. Further, except for the external power detection circuit 3240, the non-volatile memory device 3221 shown in FIG. 22 includes the same like-named elements shown in previously described FIG. 3, and accordingly, a detailed description of those elements is omitted below to avoid redundancy in the description.

Referring to FIG. 21, a pad 3230 receives an external high voltage Ext_Vpp from a host 3100, and the external high voltage Ext_Vpp is provided to a first non-volatile memory device 3221. In this case, the first non-volatile memory device 3221 supports an outside voltage mode OVM, and includes an external power detecting circuit 3240 which detects an input of the external high voltage Ext_Vpp.

Referring to FIG. 22, the external power detecting circuit 3240 of the first non-volatile memory device 3221 detects whether the external high voltage Ext_Vpp is received. If an input of the external high voltage Ext_Vpp is detected, the external power detecting circuit 3240 provides a signal to control logic 460 such that an outside voltage mode OVM is activated. The control logic 460 transfers an outside voltage mode signal OVMS to a voltage generation circuit 410 in response to a control signal, and the voltage generation circuit 410 generates a pass voltage Vpass or a read pass voltage Vread using the external high voltage Ext_Vpp.

In FIG. 22, the voltage generation circuit 410 is shown as generating the pass voltage Vpass or the read pass voltage Vread using the external high voltage Ext_Vpp. However, the inventive concepts are not limited thereto. For example, as illustrated in FIG. 14, the voltage generation circuit 410 can be configured to generate a verification read voltage Vvfy or a read voltage Vrd using the external high voltage Ext_Vpp. As another example, as illustrated in FIG. 18, the voltage generation circuit 410 can be configured to generate a pass voltage Vpass, a read pass voltage Vread, a verification read voltage Vvfy, or a read voltage Vrd using the external high voltage Ext_Vpp.

Figure 23:
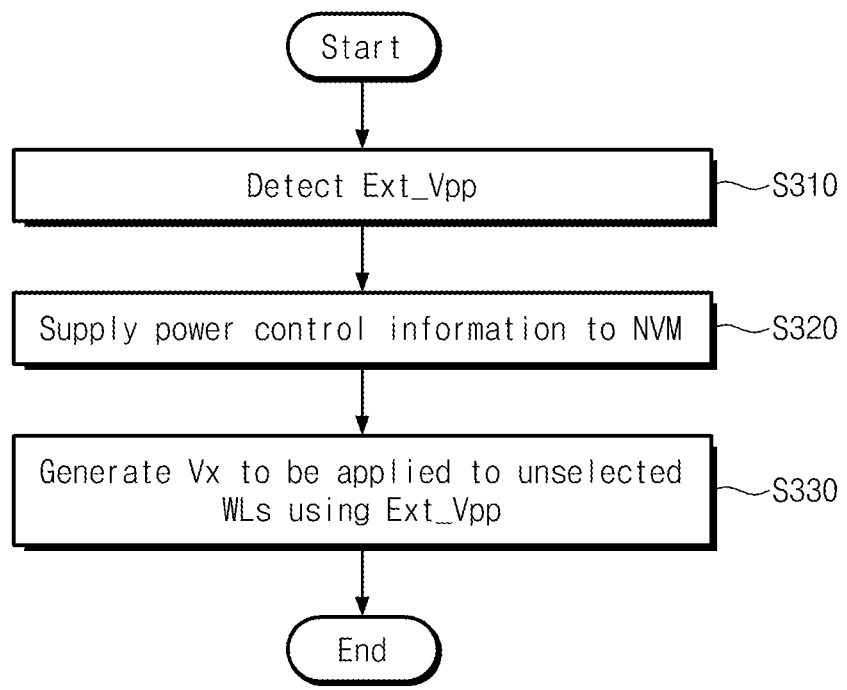
FIG. 23 is a flowchart for describing an operational example of a memory system shown in FIG. 20 according to one or more embodiments of the inventive concepts.

FIG. 23 is a flowchart for describing an operation of a memory system shown in FIG. 20 according to an exemplary embodiment of the inventive concepts.

At operation 5310, an external power detecting circuit 2211 of the memory system 2200 detects whether an external high voltage Ext_Vpp is received via a pad 2230.

At operation 5320, if the input of the external high voltage Ext_Vpp is detected, the external power detecting circuit 2211 activates an outside voltage mode OVM of a non-volatile memory device. Meanwhile, the external high voltage Ext_Vpp received via the pad 2230 is provided to a non-volatile memory device set to the outside voltage mode OVM.

At operation 5330, the non-volatile memory device set to the outside voltage mode OVM generates word line voltages Vx using the external high voltage Ext_Vpp. The word line voltages Vx are discussed above in connection with operation S130 of FIG. 19.

Figure 24:
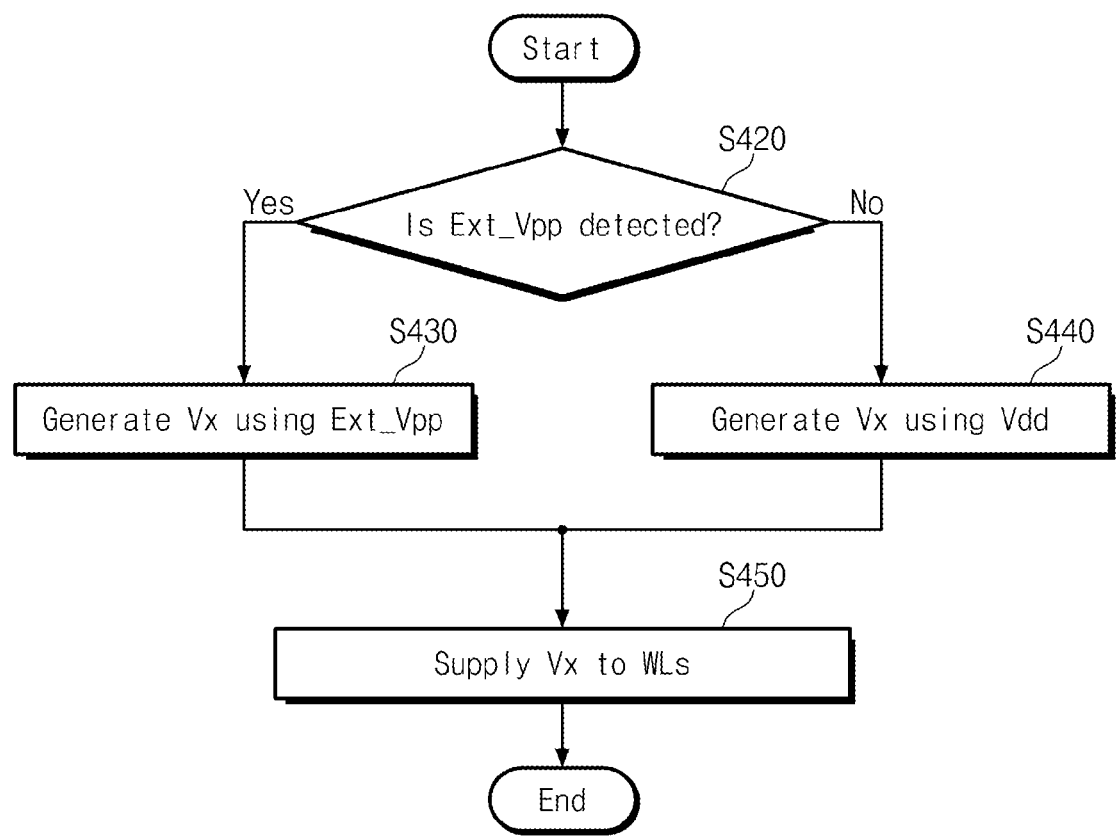
FIG. 24 is a flowchart for describing an operational example of a non-volatile memory device supporting an outside voltage mode OVM shown in FIGS. 21 and 22.

FIG. 24 is a flowchart for describing an operation of a non-volatile memory device supporting an outside voltage mode OVM in FIGS. 21 and 22.

At operation 5401, a control logic 460 of the non-volatile memory device 3221 receives a request for generation of word line voltages Vx from a memory controller 3210.

At operation 5420, an external power detecting circuit 3240 detects an input of an external high voltage Ext_Vpp (S420).

At operation 5430, if the external high voltage Ext_Vpp is detected, a voltage generation circuit 410 generates word line voltages Vx using the external high voltage Ext_Vpp, based upon a request necessitating generation of the word line voltages Vx. Herein, a request necessitating the generation of the word line voltages Vx may include a program command or a read command.

At operation S440, if the external high voltage Ext_Vpp is not detected, the voltage generation circuit 410 generates the word line voltages Vx using a power supply voltage Vdd according to the request necessitating the generation of the word line voltages Vx.

At operation S450, the word line voltages are provided to corresponding word lines. The word line voltages Vx are discussed above in connection with operation S130 of FIG. 19.

As described above, embodiments of the inventive concepts are applicable to both the programming and reading of non-volatile memory devices. An example of a programming method of a non-volatile memory device is disclosed in detail in U.S. Pat. Nos. 6,335,881 and 7,064,986, the entireties of which are incorporated by references herein. An example of a read method of a non-volatile memory device is disclosed in detail in U.S. Patent Publication No. 2101/0039861, the entirety of which is incorporated by reference herein.

In the embodiments described above, word line voltages are generated from the external high voltage Ext_Vpp. However, the inventive concepts also encompass the generation of other voltages from the external high voltage Ext_Vpp, such as voltages provided to a string selection line and/or a ground selection line of a memory cell array.

Non-volatile memory devices according to exemplary embodiments of the inventive concepts may be implemented, for example, using devices with 2-dimensional (2D) NAND flash memory arrays and 3-dimensional (3D) flash memory arrays (also referred to as vertical NAND flash memory VNAND devices). Exemplary vertical NAND flash memory devices are disclosed in U.S. Patent Publication Nos. 2009/0306583, 2010/0078701, 2010/0117141, 2010/0140685, 2010/02135527, 2010/0224929, 2010/0315875, 2010/0322000, 2011/0013458, and 2011/0018036, the entireties of which are incorporated by references herein.

Figure 25:
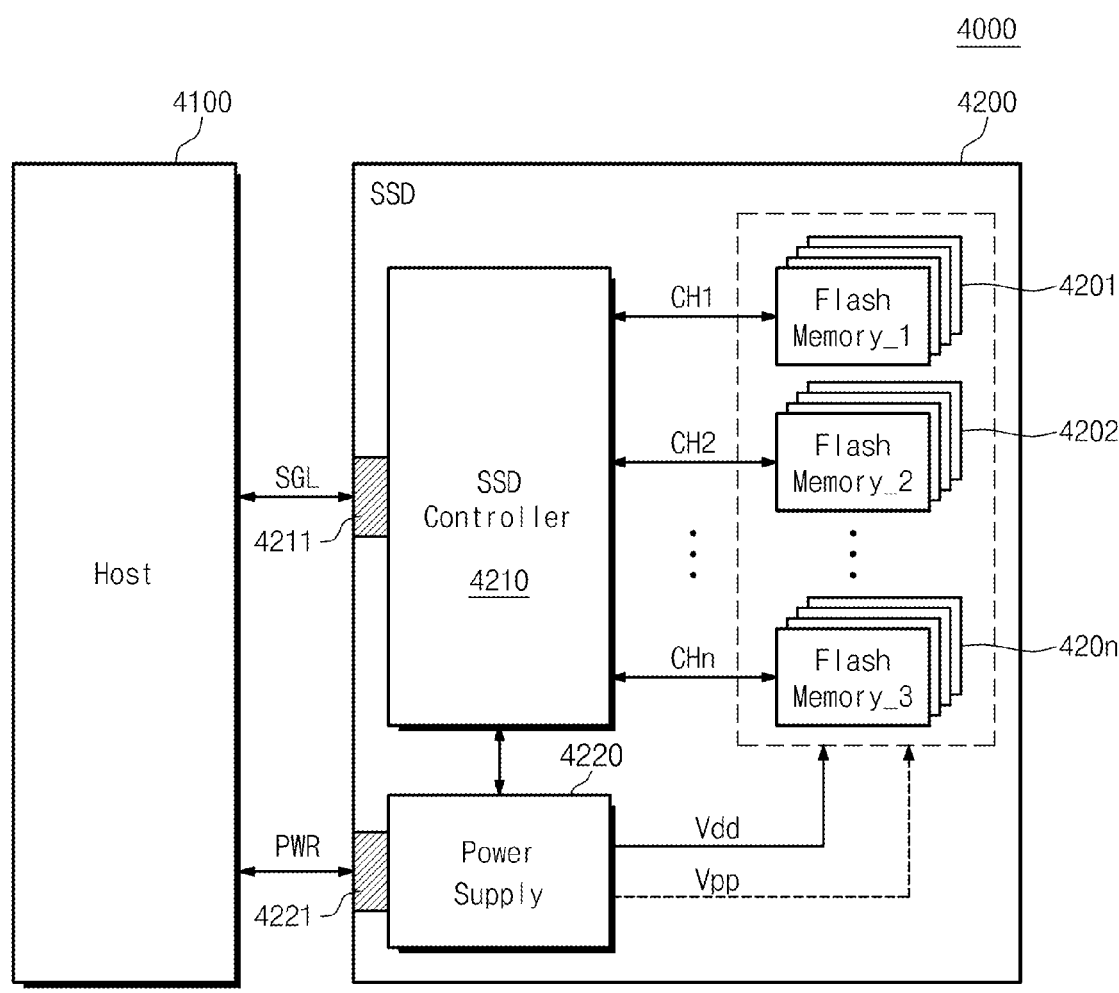
FIG. 25 is a block diagram of a solid state drive including a memory system according to one or more embodiments of the inventive concepts.

FIG. 25 is a block diagram of a solid state drive SSD including a memory system according to an exemplary embodiment of the inventive concepts. Referring to FIG. 25, an SSD system 4000 includes a host 4100 and an SSD 4200. The SSD 4200 transacts signals with the host 4100 via a signal connector 4211, and receives power via a power connector 4221. The SSD 4200 includes a plurality of non-volatile memory devices 4201 to 420n, an SSD controller 4210, and a power supply 4220.

The plurality of non-volatile memory devices 4201 to 420n is used as a storage media. The SSD 4200 may be primarily implemented with flash memory. Alternatively, the SSD 4200 may be implemented with other non-volatile memory such as PRAM, MRAM, ReRAM, FRAM, and or like. Further, the SSD 4200 may be implemented with different types of non-volatile memory.

The power supply 4220 provides power to the plurality of non-volatile memory devices 4201 to 420n. Further, when supplied with an external high voltage Ex_Vpp from the host 4100, the power supply 4220 provides the external high voltage Ext_Vpp to one or more of non-volatile memory devices 4201 to 420n. In this case, the SSD controller 4210 sets one or more of non-volatile memory devices 4201 to 420n to outside voltage mode OVM as described previously according to earlier embodiments of the inventive concepts.

The SSD controller 4210 transmits and receives a signal SGL to and from the host 4100 via the signal connector 4211. Herein, the signal SGL may include a command, an address, data, and the like. The SSD controller 4210 writes or reads data in or from a corresponding memory device, based upon a command from the host 4100. The SSD controller 4210 may be configured in same manner as the memory controller 1210 described previously in connection with FIG. 2.

Figure 26:
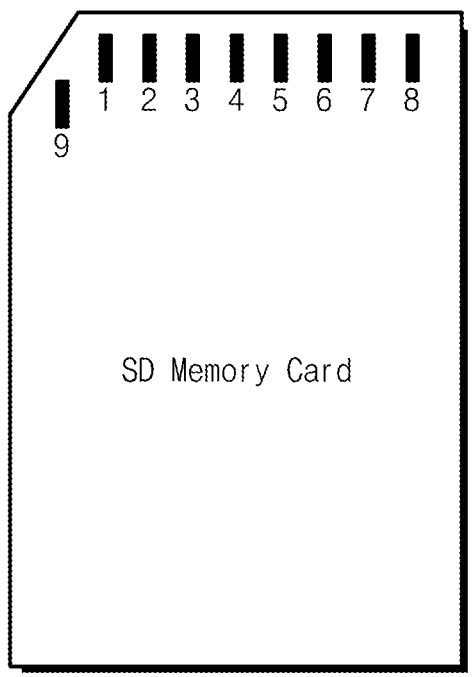
FIG. 26 is a diagram of a memory card including a memory system according to one or more embodiments of the inventive concepts.

FIG. 26 is a diagram of a memory card as an exemplary embodiment of the inventive concepts. In particular, FIG. 26 is a perspective view an SD card. Referring to FIG. 26, the SD card includes nine pins. For example, the SD card includes four data pins (e.g., 1, 7, 8, 9), one command pin (e.g., 2), one clock pin (e.g., 5), and three power pins (e.g., 3, 4, 6).

Herein, a command and a response signal are transferred via the command pin 2. Typically, the command is transferred to the memory card from a host, and the response signal is transferred to the host from the memory card. According to example embodiments of the inventive concepts, at least one of the three power pins is used to receive the external high voltage Ext_Vpp described previously, and the command pin 2 is used to receive the external power enable signal EPM_en described previously.

Figure 27:
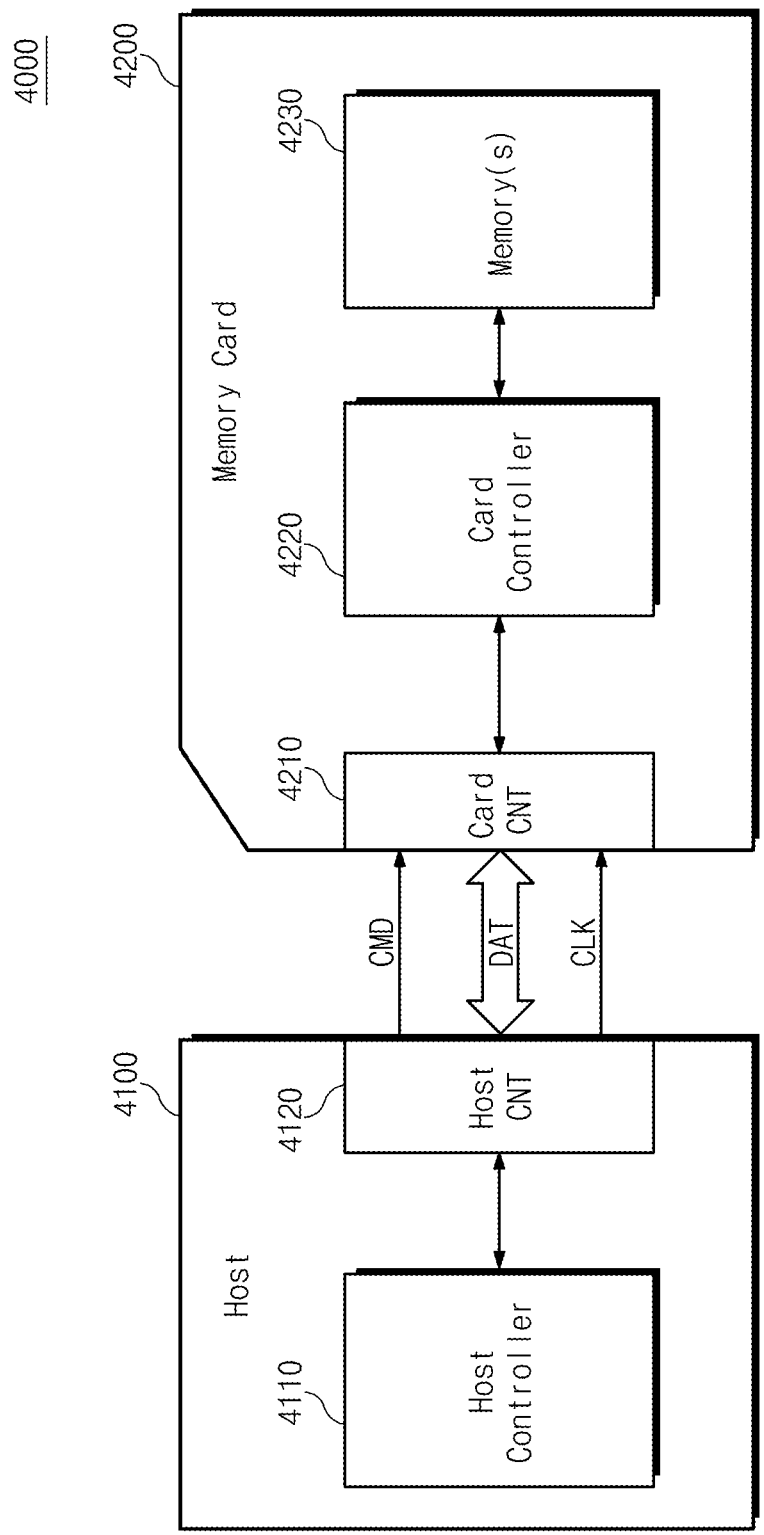
FIG. 27 is a block diagram illustrating an example of a memory card shown in FIG. 26.

FIG. 27 is a block diagram of a memory card in FIG. 26. A memory card system 4000 includes a host 4100 and a memory card 4200. The host 4100 includes a host controller 4110 and a host connection unit 4120. The memory card 4200 includes a card connection unit 4210, a card controller 4200, and a memory 4230.

The host connection unit 4120 and the card connection unit 4210 are formed of a plurality of pins, which may include a command pin, a data pin, a clock pin, a power pin, and so on. The number of pins may vary depending on type of memory card 4200.

The host 4100 writes or reads data in or from the memory card 4200. The host controller 4110 provides the memory card 4200 with a command (e.g., a write command), a clock CLK generated by a clock generator (not shown) within the host 4100, and data via the host connection unit 4120.

The card controller 4220 responds to a write command received via the card connection unit 4210 to store data in the memory 4230 in synchronization with a clock generated by a clock generator (not shown) within the card controller 4220. The memory 4230 stores data transferred from the host 4100. For example, if the host 4100 is a digital camera, the memory 4230 stores image data.

Herein the memory 4230 includes at least one non-volatile memory device (e.g., non-volatile memory device 1221 of FIG. 3) supporting an outside voltage mode OVM. The memory 4230 receives an external high voltage Ext_Vpp to generate word line voltages using the external high voltage Ext_Vpp as described in connection with previous embodiments of the inventive concepts.

Figure 28:
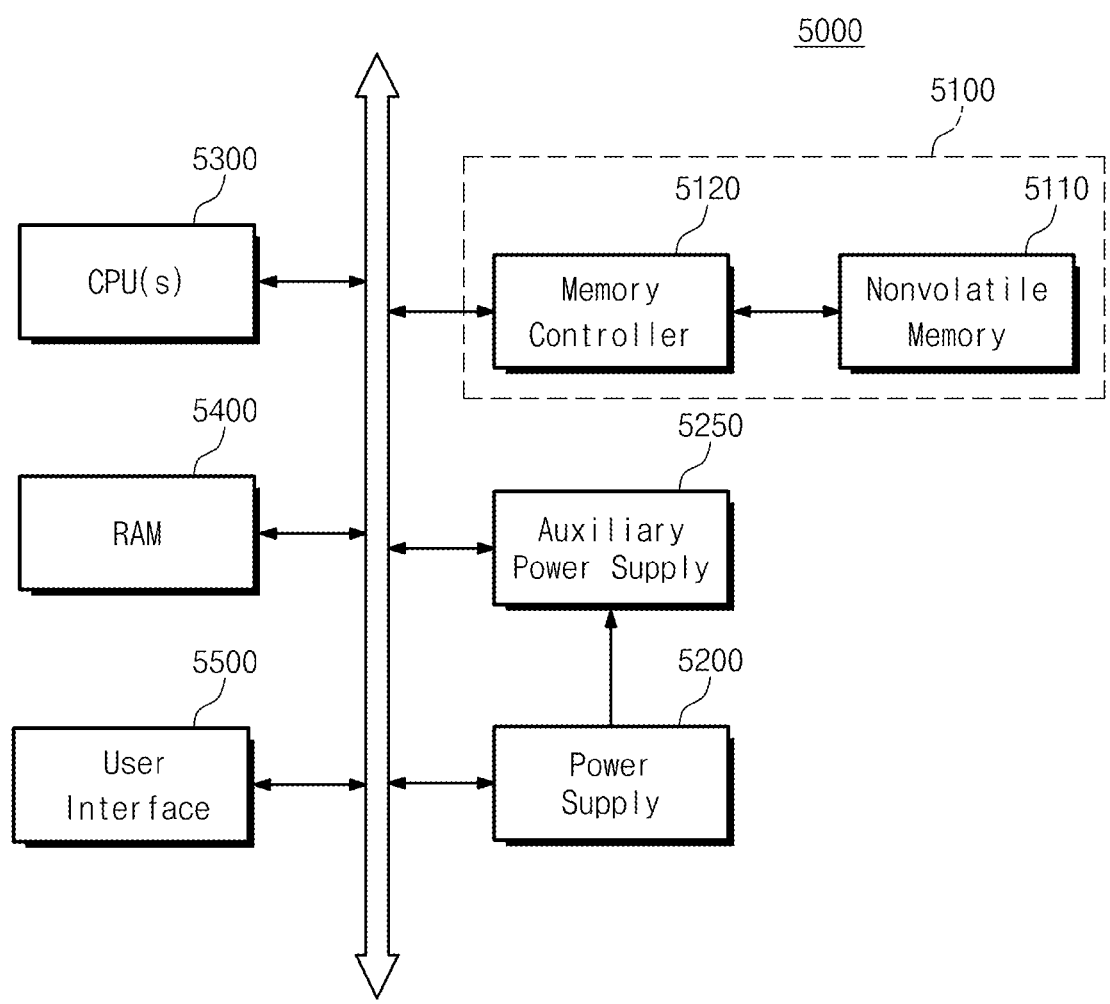
FIG. 28 is a block diagram of an electronic device including a flash memory device according to one or more embodiments of the inventive concepts.

FIG. 28 is a block diagram of an electronic device 5000 including a flash memory device according to an exemplary embodiment of the inventive concepts. The electronic device 5000 may, for example, be implemented by a personal computer or a handheld electronic device such as a notebook computer, a cellular phone, a PDA, a camera, and the like.

Referring to FIG. 28, the electronic device 5000 includes a semiconductor memory device 5100, a power supply 5200, an auxiliary power supply 5250, at least one CPU 5300, a RAM 5400, and a user interface 5500. The semiconductor memory device 5100 includes at least one non-volatile memory 5110 and a memory controller 5120.

In FIG. 28, the auxiliary power supply 5250 or the power supply 5200 provides a high voltage (i.e., an external high voltage Ext_Vpp) to the non-volatile memory device 5110. The non-volatile memory device 5110 generates a word line voltage using the external high voltage Ext_Vpp as described in connection with previous embodiments of the inventive concepts.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A memory system, comprising:
   at least one nonvolatile memory device;
   a memory controller configured to control the at least one nonvolatile memory device; and
   a power supply configured to supply a supply voltage and a high voltage as externally supplied voltages to the at least one nonvolatile memory device, the high voltage being higher than the supply voltage,
   wherein the at least one nonvolatile memory device receives the supply voltage from the power supply and generates a first high voltage from the received supply voltage, and receives the high voltage from the power supply and generates a second high voltage from the high voltage, the first and second high voltages for operations being controlled by the memory controller,
   wherein first high voltage and the second high voltage are applied to word lines of the at least one nonvolatile memory device during a programming operation.

2. The memory system of claim 1, wherein the first high voltage is a pass voltage and the second high voltage is a program voltage higher than the pass voltage.

3. The memory system of claim 1, wherein the first high voltage is a program voltage and the second high voltage is a pass voltage lower than the program voltage.

4. The memory system of claim 3, wherein the program voltage is generated by charge pumping of the supply voltage.

5. The memory system of claim 3, wherein the pass voltage is generated by voltage division of the high voltage.

6. The memory system of claim 1, wherein the first and second high voltages are a pass voltage higher than the supply voltage.

7. The memory system of claim 6, wherein the pass voltage is generated by voltage division of the high voltage or an internal high voltage,
   wherein the internal high voltage is generated by charge pumping the supply voltage.

8. The memory system of claim 7, wherein the pass voltage is generated by voltage division of the high voltage in response to an outside voltage mode signal,
   wherein the outside voltage mode signal is transferred from the memory controller.

9. The memory system of claim 1, wherein the power supply supplies the supply voltage to the memory controller.

10. The memory system of claim 1, further comprising an auxiliary power supply configured to generate the high voltage.

11. The memory system of claim 1, further comprising a volatile memory device configured to store write data to the at least one nonvolatile memory device or data read out from the at least one nonvolatile memory device.

12. The memory system of claim 1, further comprising a detecting circuit configured to detect whether an external voltage is supplied from a host and to transfer a result of the detection to the memory controller.

13. The memory system of claim 1, wherein the memory system is a solid state drive.

14. An electronic device, comprising,
a host; and
a storage device configured to store write data from the host and to output read data to the host,
wherein the storage device comprises:
a plurality of nonvolatile memory devices;
a memory controller configured to control the nonvolatile memory devices; and
a power supply configured to supply a supply voltage and a high voltage as externally supplied voltages to the plurality of nonvolatile memory devices, the high voltage being higher than the supply voltage,
wherein each of the nonvolatile memory device receives the supply voltage and generates a first high voltage from the supply voltage, and receives the high voltage and generates a second high voltage from the high voltage, the first and second high voltages applied to word lines during operations being controlled by the memory controller.

15. The electronic device of claim 14, wherein the host supplies an external voltage to the storage device.

16. The electronic device of claim 15, wherein the power supply receives the external voltage from the host and generates the supply voltage and the high voltage.

17. The electronic device of claim 14, wherein the storage device further comprises an auxiliary power supply configured to generate the high voltage.

18. The electronic device of claim 14, wherein the supply voltage is supplied to nonvolatile memory devices through a voltage regulator.

19. A method of generating an operating voltage of a storage device including a plurality of nonvolatile memory devices and a memory controller configured to control the nonvolatile memory devices, comprising:
receiving an external voltage from a host;
generating a supply voltage and a high voltage higher than the supply voltage using the external voltage;
supplying the supply voltage and the high voltage as externally supplied voltages to the nonvolatile memory devices;
generating a first high voltage by charge pumping the supply voltage; and
generating a second high voltage by voltage division of the high voltage,
wherein at least one of the first high voltage and the second high voltage is used as a program voltage or a pass voltage applied to a word line in at least one program operation of the nonvolatile memory devices.

20. The method of claim 19, further comprising detecting a level of the external voltage.

* * * * *